(12) United States Patent
Kim et al.

(10) Patent No.: US 9,997,566 B1
(45) Date of Patent: Jun. 12, 2018

(54) MAGNETORESISTIVE RANDOM ACCESS MEMORY DEVICES AND METHODS OF MANUFACTURING THE SAME

(71) Applicant: Samsung Electronics Co., Ltd., Suwon-si, Gyeonggi-do (KR)

(72) Inventors: Sang-Kuk Kim, Seongnam-si (KR); Jong-Kyu Kim, Seongnam-si (KR); Jong-Chul Park, Seongnam-si (KR); Jong-Soon Park, Suwon-si (KR); Hye-Ji Yoon, Hwaseong-si (KR); Woo-Hyun Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days. days.

(21) Appl. No.: 15/602,469

(22) Filed: May 23, 2017

(30) Foreign Application Priority Data

Dec. 6, 2016 (KR) .................. 10-2016-0165181

(51) Int. Cl.
| | |
|---|---|
| *H01L 43/12* | (2006.01) |
| *H01L 27/22* | (2006.01) |
| *H01L 43/02* | (2006.01) |
| *H01L 43/08* | (2006.01) |
| *H01L 29/423* | (2006.01) |

(52) U.S. Cl.
CPC .......... *H01L 27/228* (2013.01); *H01L 27/222* (2013.01); *H01L 43/02* (2013.01); *H01L 43/08* (2013.01); *H01L 43/12* (2013.01); *H01L 29/4236* (2013.01)

(58) Field of Classification Search
CPC ...... H01L 43/12; H01L 27/222; H01L 27/228
See application file for complete search history.

(56) References Cited

U.S. PATENT DOCUMENTS

| | | |
|---|---|---|
| 8,828,742 B2 | 9/2014 | Iba |
| 9,070,869 B2 | 4/2015 | Jung et al. |
| 9,224,944 B2 | 12/2015 | Takahashi et al. |
| 9,419,211 B2 | 8/2016 | Nishimura et al. |

(Continued)

FOREIGN PATENT DOCUMENTS

| | | |
|---|---|---|
| JP | 2016029696 A | 3/2016 |
| KR | 101073132 B1 | 10/2011 |

*Primary Examiner* — Ermias Woldegeorgis
(74) *Attorney, Agent, or Firm* — Harness, Dickey & Pierce, P.L.C.

(57) ABSTRACT

Manufacturing an MRAM device may include forming an upper electrode on a magnetic tunnel junction stack, where the stack may include a lower electrode layer, a magnetic tunnel junction layer and a middle electrode layer that are sequentially formed on an insulating interlayer and a lower electrode contact on a substrate. The upper electrode may be formed on the middle electrode layer. An upper electrode protective structure may be formed to cover at least a sidewall and an upper surface of the upper electrode. The middle electrode layer, the magnetic tunnel junction layer and the lower electrode may be patterned by an etching process to form a middle electrode, a magnetic tunnel junction pattern and a lower electrode, respectively. The upper electrode protective structure may isolate the upper electrode from exposure during the patterning, and the upper electrode protective structure may remain on the upper electrode subsequently to the patterning.

20 Claims, 22 Drawing Sheets

(56) References Cited

U.S. PATENT DOCUMENTS

| | | | |
|---|---|---|---|
| 2007/0040198 A1* | 2/2007 | Matsuura | H01L 27/11502 257/296 |
| 2013/0037894 A1* | 2/2013 | Chung | H01L 43/12 257/421 |
| 2015/0188037 A1 | 7/2015 | Nam et al. | |
| 2016/0035969 A1 | 2/2016 | Kang et al. | |

* cited by examiner

MAGNETORESISTIVE RANDOM ACCESS MEMORY DEVICES AND METHODS OF MANUFACTURING THE SAME

CROSS-REFERENCE TO RELATED APPLICATIONS

This application claims priority under 35 USC § 119 to Korean Patent Application No. 10-2016-0165181, filed on Dec. 6, 2016 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to magnetoresistive random access memory (MRAM) devices and methods of manufacturing the same.

2. Description of the Related Art

When an MRAM device is manufactured, a magnetic tunnel junction (MTJ) layer may be etched by a physical etching process to form an MTJ structure. During the physical etching process, other conductive layers in the MTJ layer may be also etched together with the MTJ layer, and thus elements of the etched conductive layers may be re-deposited, as conductive by-products, on a sidewall of the MTJ structure, which may generate an electrical short.

SUMMARY

Some example embodiments provide methods of manufacturing an MRAM device having improved characteristics.

Some example embodiments provide MRAM devices having improved characteristics.

According to some example embodiments, a method of manufacturing an MRAM device may include forming an insulating interlayer and a lower electrode contact on a substrate, the lower electrode contact extending through the insulating interlayer. The method may include sequentially forming, on the insulating interlayer and the lower electrode contact, a lower electrode layer, a magnetic tunnel junction layer and a middle electrode layer. The method may include forming an upper electrode on the middle electrode layer and forming an upper electrode protective structure covering a sidewall of the upper electrode and an upper surface of the upper electrode. The method may include patterning the middle electrode layer, the magnetic tunnel junction layer and the lower electrode according to an etching process, and using the upper electrode and the upper electrode protective structure as an etching mask, to form a middle electrode, a magnetic tunnel junction pattern and a lower electrode, respectively, such that the upper electrode protective structure isolates the upper electrode from exposure during the patterning and the upper electrode protective structure remains on the upper electrode subsequently to the patterning.

According to some example embodiments, a method of manufacturing an MRAM device may include forming an insulating interlayer and a lower electrode contact on a substrate, the lower electrode contact extending through the insulating interlayer. The method may include sequentially forming, on the insulating interlayer and the lower electrode contact, a lower electrode layer, a magnetic tunnel junction layer and a middle electrode layer. The method may include forming a mold pattern on the middle electrode layer, the mold pattern including an opening, the opening exposing an upper surface of the middle electrode layer. The method may include forming an upper electrode and an upper electrode protective structure in the opening, the upper electrode protective structure covering a surface of the upper electrode in the opening. The method may include removing the mold pattern and patterning the middle electrode layer, the magnetic tunnel junction layer and the lower electrode according to an etching process, and using the upper electrode and the upper electrode protective structure as an etching mask, to form a middle electrode, a magnetic tunnel junction pattern and a lower electrode, respectively, such that the upper electrode protective structure isolates the upper electrode from exposure during the patterning and the upper electrode protective structure remains on the upper electrode subsequently to the patterning.

According to some example embodiments, a method of manufacturing an MRAM device may include forming an insulating interlayer and a lower electrode contact on a substrate, the lower electrode contact extending through the insulating interlayer. The method may include sequentially forming, on the insulating interlayer and the lower electrode contact, a lower electrode layer, a magnetic tunnel junction layer and a middle electrode layer. The method may include forming a stacked structure on the middle electrode layer, the stacked structure including an upper electrode and a hard mask. The method may include forming an upper electrode protective structure covering a sidewall of the upper electrode and an upper surface of the upper electrode. The method may include forming an insulation spacer on a sidewall of the stacked structure. The method may include patterning the middle electrode layer, the magnetic tunnel junction layer and the lower electrode according to an etching process, and using the upper electrode, the upper electrode protective structure and the spacer as an etching mask, to form a middle electrode, a magnetic tunnel junction pattern and a lower electrode, respectively, such that the upper electrode protective structure isolates the upper electrode from exposure during the patterning and the upper electrode protective structure remains on the upper electrode subsequently to the patterning.

According to some example embodiments an MRAM device may include an insulating interlayer, a lower electrode contact, a lower electrode, a magnetic tunnel junction pattern, a middle electrode, an upper electrode and an upper electrode protective structure. The insulating interlayer may be formed on a substrate. The lower electrode contact may extend through the insulating interlayer. The lower electrode, the magnetic tunnel junction pattern and the middle electrode may be sequentially stacked on the lower electrode contact. The upper electrode may be formed on the middle electrode. An upper electrode protective structure may cover a sidewall and an upper surface of the upper electrode.

According to some example embodiments, a method may include forming an upper electrode and an upper electrode protective structure on a magnetic tunnel junction stack, the magnetic tunnel junction stack including a lower electrode layer, a magnetic tunnel junction layer, and a middle electrode layer, the upper electrode protective structure covering at least one surface of a sidewall of the upper electrode and an upper surface of the upper electrode. The method may include patterning the magnetic tunnel junction stack according to an etching process, using the upper electrode and the upper electrode protective structure as an etching mask, to form a middle electrode, a magnetic tunnel junction pattern and a lower electrode, respectively, such that the upper electrode protective structure isolates the upper electrode from exposure during the patterning and the upper electrode protective structure remains on the upper electrode subsequently to the patterning.

In the MRAM device according to some example embodiments, an electrical short due to a conductive by-product may decrease. Thus, the MRAM device may have good characteristics.

BRIEF DESCRIPTION OF THE DRAWINGS

Example embodiments will be more clearly understood from the following detailed description taken in conjunction with the accompanying drawings.

FIG. 1, FIG. 2, FIG. 3, FIG. 4, FIG. 5, FIG. 6, FIG. 7, FIG. 8, FIG. 9, and FIG. 10 are cross-sectional views illustrating stages of a method of manufacturing an MRAM device according to some example embodiments;

FIG. 11, FIG. 12, FIG. 13, FIG. 14, FIG. 15, FIG. 16, FIG. 17, FIG. 18, FIG. 19, FIG. 20, and FIG. 21 are cross-sectional views illustrating stages of a method of manufacturing an MRAM device according to some example embodiments;

FIG. 22, FIG. 23, FIG. 24, FIG. 25, FIG. 26, FIG. 27, and FIG. 28 are cross-sectional views illustrating stages of a method of manufacturing an MRAM device according to some example embodiments;

FIG. 29, FIG. 30, FIG. 31, and FIG. 32 are cross-sectional views illustrating stages of a method of manufacturing an MRAM device according to some example embodiments.

DETAILED DESCRIPTION

Some detailed example embodiments are disclosed herein. However, specific structural and functional details disclosed herein are merely representative for purposes of describing example embodiments. Some example embodiments may be embodied in many alternate forms and should not be construed as limited to only the example embodiments set forth herein.

When the terms "about" or "substantially" are used in this specification in connection with a numerical value, it is intended that the associated numerical value include a tolerance of ±10% around the stated numerical value. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

FIG. 1, FIG. 2, FIG. 3, FIG. 4, FIG. 5, FIG. 6, FIG. 7, FIG. 8, FIG. 9, and FIG. 10 are cross-sectional views illustrating stages of a method of manufacturing an MRAM device according to some example embodiments.

Figure 1:
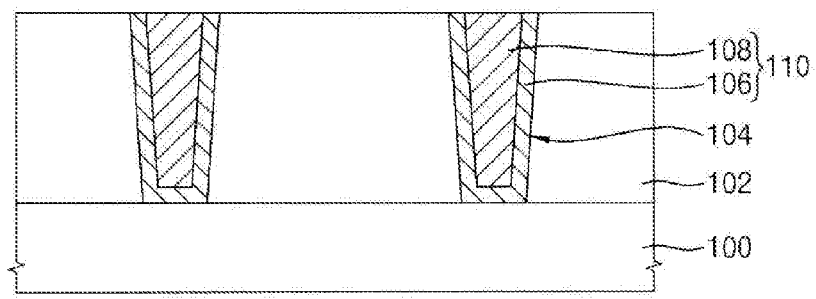
FIGS. 1 to 32 represent non-limiting, example embodiments as described herein.

Referring to FIG. 1, a first insulating interlayer 102 may be formed on a substrate 100. A lower electrode contact 110 may be formed through the first insulating interlayer 102.

The substrate 100 may include a semiconductor material, e.g., silicon, germanium, silicon-germanium, or III-V semiconductor compounds, e.g., GaP, GaAs, GaSb, etc. In some example embodiments, the substrate 100 may be a silicon-on-insulator (SOI) substrate or a germanium-on-insulator (GOI) substrate.

Various types of elements (not shown), e.g., word lines, transistors, diodes, source/drain regions, source lines, contact plugs, wirings, etc., and an insulating interlayer (not shown) covering the elements may be further formed on the substrate 100.

The first insulating interlayer 102 may include silicon oxide, or a low-k dielectric material having a dielectric constant less than that of silicon oxide, e.g., less than about 3.9.

In some example embodiments an etching mask (not shown) may be formed on the first insulating interlayer 102. The first insulating interlayer 102 may be anisotropically etched using the etching mask to form a first opening 104 exposing an upper surface of the substrate 100. The anisotropic etching process may include a chemical etching process, e.g., a reactive ion etching (RIE) process.

A barrier layer may be formed on an inner wall of the first opening 104, the exposed upper surface of the substrate 100, and the first insulating interlayer 102. A first conductive layer may be formed on the first barrier layer to fill the first opening 104. In some example embodiments, the first barrier layer and the first conductive layer may be formed by a chemical vapor deposition (CVD) process or an atomic layer deposition (ALD) process. The first barrier layer may be formed of ("may at least partially comprise"), e.g., a metal nitride, e.g., tungsten nitride, tantalum nitride, titanium nitride, etc., and/or a metal, e.g., tantalum, titanium, etc., and the first conductive layer may be formed of a metal having a low resistance, e.g., tungsten, copper, aluminum, etc.

The first barrier layer and the first conductive layer may be planarized until an upper surface of the first insulating interlayer 102 may be exposed to form a lower electrode contact 110 filling the first opening 104. The lower electrode contact 110 may include a first barrier pattern 106 and a conductive pattern 108.

Figure 2:
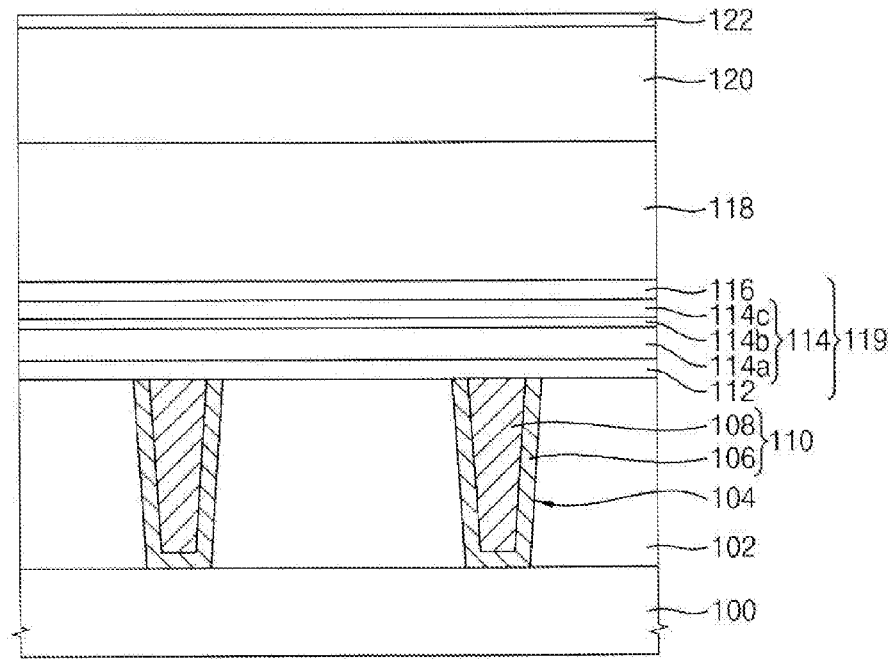

Referring to FIG. 2, a lower electrode layer 112, an MTJ layer 114 and a middle electrode layer 116 may be sequentially formed on the first insulating interlayer 102 and the lower electrode contact 110 to form a magnetic tunnel junction stack 119. A mold layer 118, a first hard mask layer 120 and a second hard mask layer 122 may be sequentially formed on the middle electrode layer 116.

The lower electrode layer 112 may be formed of ("may at least partially comprise") a metal having a specific gravity less than a specific gravity of a metal in an upper electrode layer sequentially formed. The lower electrode layer 112 may be formed of e.g., a metal, e.g., tantalum, titanium, etc., and/or a metal nitride, e.g., tantalum nitride, titanium nitride, etc.

The MTJ layer 114 may include a first magnetic layer 114a, a tunnel barrier layer 114b and a second magnetic layer 114c sequentially stacked.

In some example embodiments, the first magnetic layer 114a may include a fixed layer, a lower ferromagnetic layer, an anti-ferromagnetic coupling spacer layer and an upper ferromagnetic layer. In this case, the fixed layer may be formed of, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. Each of the lower and upper ferromagnetic layers may be formed of, e.g., Fe, Ni, and/or Co. The anti-ferromagnetic coupling spacer layer may be formed of, e.g., Ru, Ir, and/or Rh.

In some example embodiments, the second magnetic layer 114c may serve as a free layer having a changeable magnetization direction. In this case, the second magnetic layer 114c may be formed of a ferromagnetic material, e.g., Fe, Ni, Co, Cr, Pt, etc. The second magnetic layer 114c may further include, e.g., boron, silicon, etc. The second magnetic layer 114c may include composite materials including at least two of the ferromagnetic materials. For example, the second magnetic layer 114c may include, e.g., CoFe, NiFe, FeCr, CoFeNi, PtCr, CoCrPt, CoFeB, NiFeSiB, CoFeSiB, etc.

The tunnel barrier layer 114b may be disposed between the first magnetic layer 114a and second magnetic layer 114c. Thus, the first magnetic layer 114a and second magnetic layer 114c may not be directly connected to each other.

In some example embodiments, the tunnel barrier layer 114b may include a metal oxide having an insulating material, e.g., aluminum oxide or magnesium oxide. In some example embodiments, the tunnel barrier layer 114b may have a thickness of about 5 Å to about 30 Å.

The middle electrode layer 116 may be formed of a metal having a specific gravity less than the specific gravity of the metal in the upper electrode layer 128 (refer to FIG. 4) sequentially formed. The middle electrode layer 116 may be formed of a metal, e.g., tantalum, titanium, etc., and/or a metal nitride, e.g., tantalum nitride, titanium nitride, etc.

Figure 7:
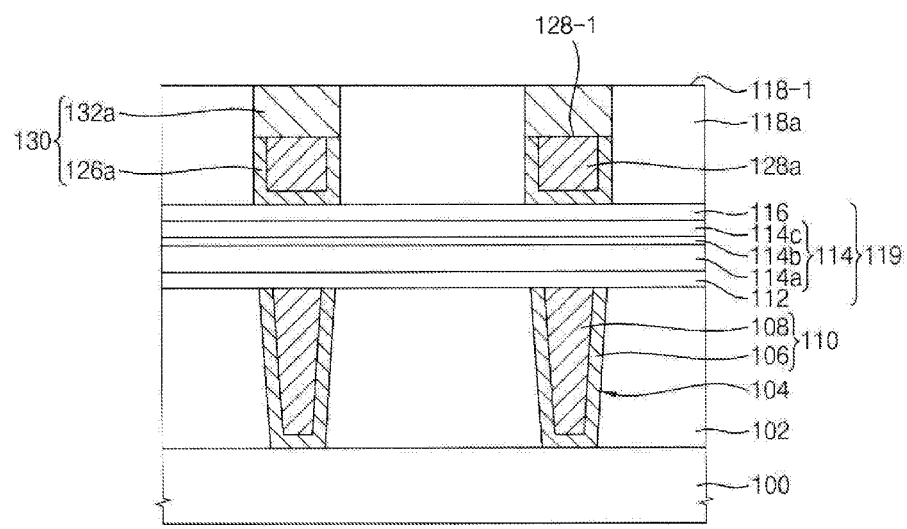

The mold layer 118 may serve as a mold for forming the upper electrode 128a (refer to FIG. 5) and an upper electrode protective structure 130 (refer to FIG. 7). The mold layer 118 may be formed of a material having an etching selectivity with respect to the upper electrode protective structure 130. In some example embodiments, the mold layer 118 may be formed of, e.g., silicon oxide, amorphous silicon or polysilicon, etc. The mold layer 118 may be formed to have a thickness equal to or greater than a height of a stacked structure including the upper electrode 128a and the upper electrode protective structure 130.

The first hard mask layer 120 may serve as (e.g., may be configured to be) an etching mask for etching the mold layer 118. Thus, the first hard mask layer 120 may be formed of a material having an etching selectivity with respect to the mold layer 118.

The second hard mask layer 122 may serve as an etching mask for etching the first hard mask layer 120. In some example embodiments, the second hard mask layer 122 may not be formed.

In some example embodiments, the first hard mask layer 120 may be a spin-on hard mask (SOH) including carbon. The second hard mask layer 122 may be formed of, e.g., silicon oxynitride or silicon nitride.

Figure 3:
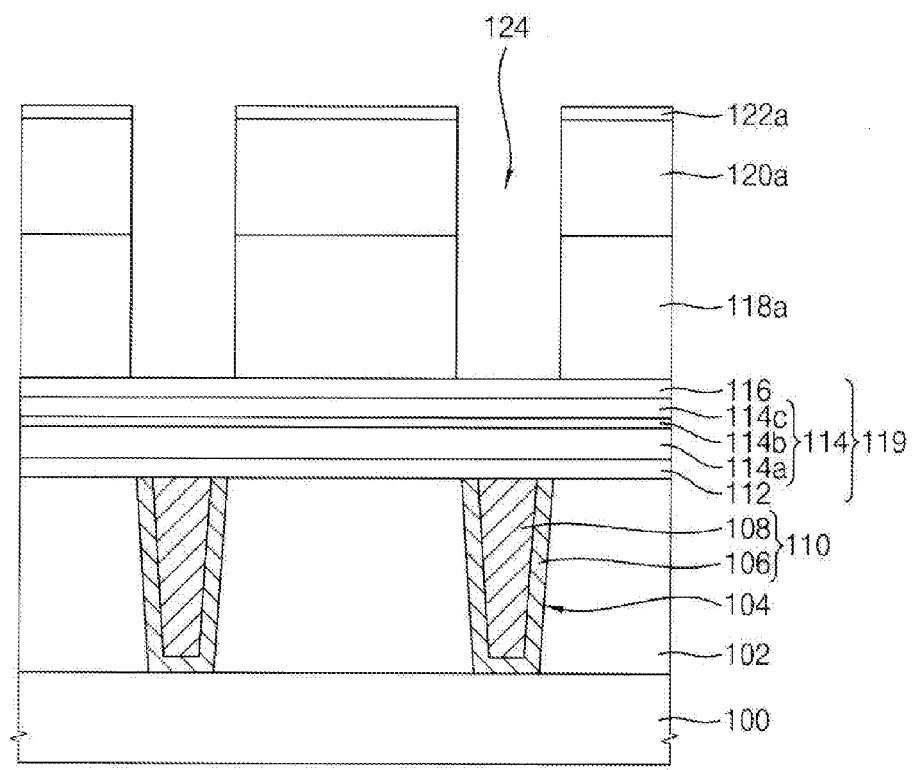

Referring to FIG. 3, the second hard mask layer 122 may be patterned by a photolithography to form a second hard mask 122a. The second hard mask 122a may include an opening at a region for forming the upper electrode 128a.

The first hard mask layer 120 may be etched using the second hard mask 122a to form a first hard mask 120a. The mold layer 118 may be etched using the first hard mask 120a to form a mold pattern 118a. The mold pattern 118a may include a second opening 124. The middle electrode layer 116 may be exposed by the second opening 124.

Figure 4:
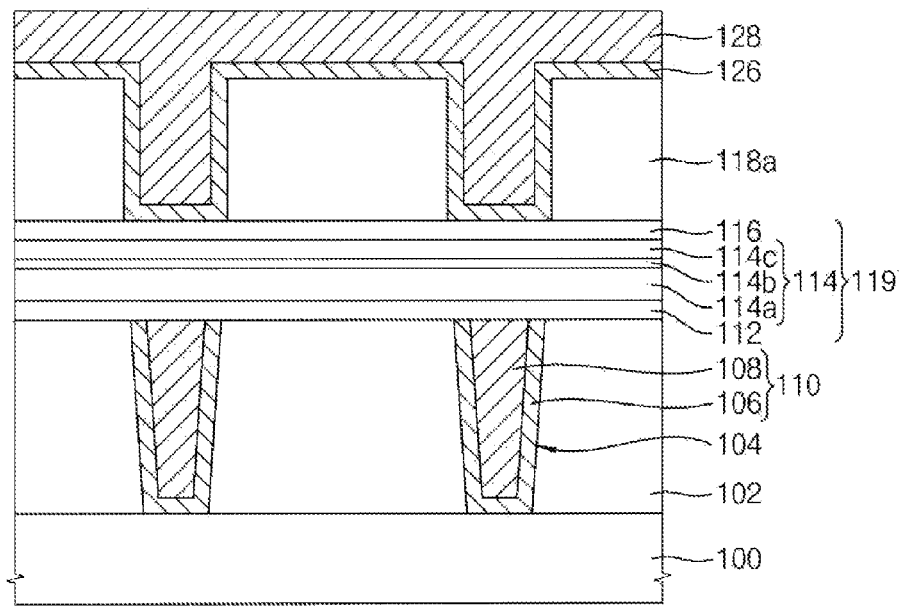

Referring to FIG. 4, the first hard mask 120a and second hard mask 122a on the mold pattern 118a may be removed. In some example embodiments, when the first hard mask 120a includes SOH, the first hard mask 120a may be removed by an ashing process. When the first hard mask 120a is removed, the second hard mask may be lifted off to be removed.

A first protective layer 126 having conductivity may be conformally formed on the magnetic tunnel junction stack 119 (e.g., on a surface of the mold pattern 118a). The first protective layer 126 may be formed of a metal having a specific gravity less than the specific gravity of the metal in the upper electrode layer 128 sequentially formed. In some example embodiments, the first protective layer 126 may have a specific gravity less than about 5.0. In some example embodiments, the first protective layer 126 may be formed of ("may at least partially comprise"), e.g., titanium or titanium nitride, etc.

The upper electrode layer 128 may be formed on the first protective layer 126 to sufficiently ("entirely or substantially entirely") fill the second opening 124 and/or such that the first protective layer 126 and the upper electrode layer 128 collectively fill an entirety or substantial entirety of the second opening 124. The upper electrode layer 128 may be formed of a conductive material having a resistance lower than a resistance of each of the first protective layer 126 and the middle electrode layer 116. The upper electrode layer 128 may be formed of a metal having a specific gravity greater than about 5.0. In some example embodiments, the upper electrode layer 128 may be formed of, e.g., tungsten, copper, platinum, nickel, silver, gold, etc. For example, the upper electrode layer 128 may be formed of tungsten.

Figure 5:
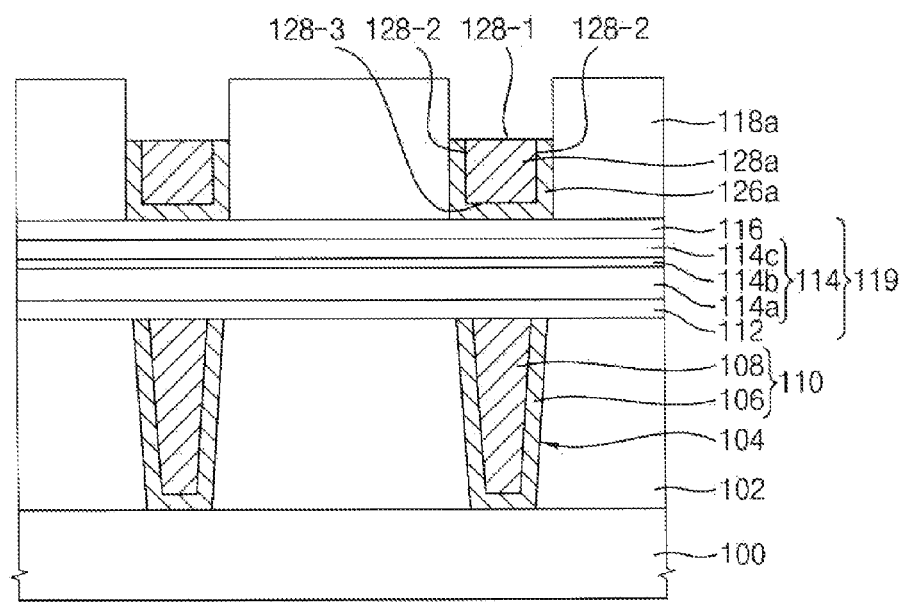

Referring to FIG. 5, portions of the first protective layer 126 and the upper electrode layer 128 on a top surface of the mold pattern 118a may be removed. The first protective layer 126 and the upper electrode layer 128 filling the second opening 124 may be partially removed to form a first protective pattern 126a and the upper electrode 128a, respectively, in a lower portion of the second opening 124. The first protective pattern 126a may cover a sidewall 128-2 and a bottom surface 128-3 of the upper electrode 128a.

In some example embodiments, the portions of the first protective layer 126 and the upper electrode layer 128 on the top surface of the mold pattern 118a may be etched by an etch back process, and then portions of the first protective layer 126 and the upper electrode layer 128 in an upper portion of the second opening 124 may be etched by an etch back process.

In some example embodiments, the portions of the first protective layer 126 and the upper electrode layer 128 on the top surface 118-1 of the mold pattern 118a may be removed by a chemical mechanical polishing (CMP) process, and then the portions of the first protective layer 126 and the upper electrode layer 128 in the upper portion of the second opening 124 may be etched by an etch back process.

Figure 6:
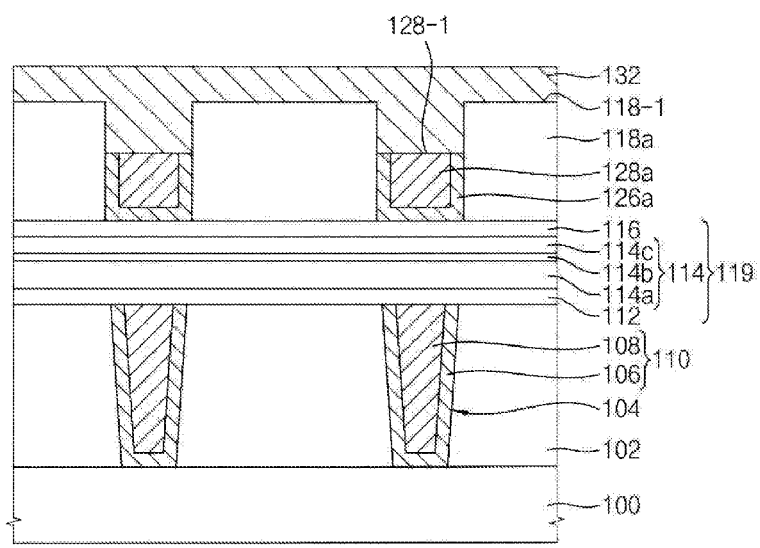

Referring to FIG. 6, a second protective layer 132 may be formed on the mold pattern 118a, the upper electrode 128a and the first protective pattern 126a to fill the second opening 124.

The second protective layer 132 may be formed of a metal having a specific gravity less than the specific gravity of the upper electrode 128a. In some example embodiments, the second protective layer 132 may be formed of, e.g., titanium or titanium nitride. In some example embodiments, the second protective layer 132 may be formed of a material substantially the same as a material of the first protective pattern 126a.

Referring to FIG. 7, the second protective layer 132 may be planarized until a top surface 118-1 of the mold pattern 118a may be exposed to form a second protective pattern 132a on the upper electrode 128a and the first protective pattern 126a. The planarization process may include a CMP process or an etch back process.

The second protective pattern 132a may cover an upper surface 128-1 of the upper electrode 128a. Thus, at least one surface of the upper electrode 128a may be covered with the first and second protective patterns 126a and 132a, so that the first and second protective patterns may, individually or collectively, isolate the upper electrode 128a from exposure. The first and second protective patterns 126a and 132a may serve as the upper electrode protective structure 130 configured to protect and cap the upper electrode 128a.

Figure 8:
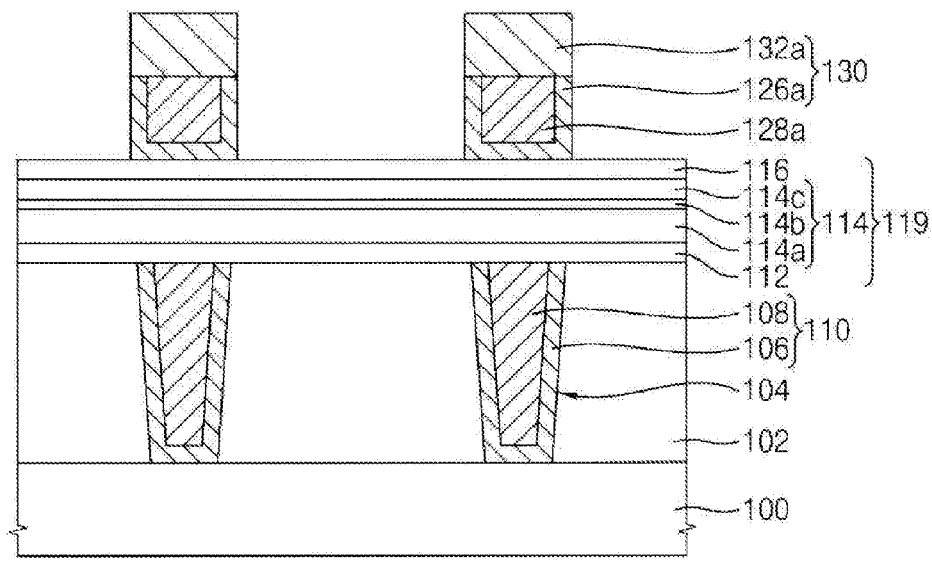

Referring to FIG. 8, the mold pattern 118a may be removed by, e.g., a wet etching process.

In some example embodiments, when the mold pattern 118a includes silicon oxide, the mold pattern 118a may be etched by a wet etching process using an etchant including hydrogen fluoride (HF)

Figure 9:
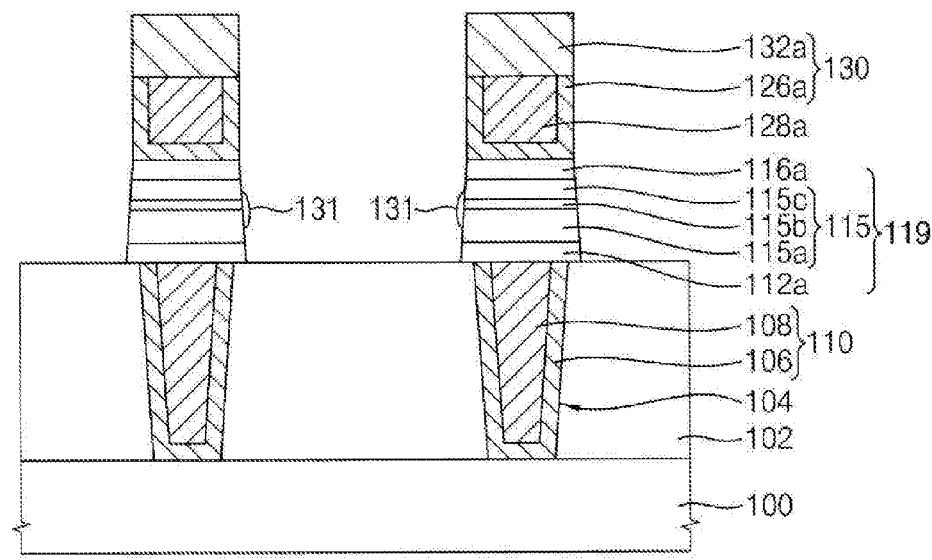

Referring to FIG. 9, the middle electrode layer 116, the MTJ layer 114 and the lower electrode layer 112 may be sequentially etched using the upper electrode 128a and the upper electrode protective structure 130 as an etching mask. Thus, a structure 119-1 including a lower electrode 112a, an MTJ structure 115 and a middle electrode 116a may be formed on the lower electrode contact 110. The MTJ structure 115 may have a staked structure including a first magnetic pattern 115a, a tunnel barrier pattern 115b and a second magnetic pattern 115c. Hereinafter, the etching process for forming the lower electrode 112a, the MTJ structure 115 and the middle electrode 116a is referred to as a first etching process.

In some example embodiments, the first etching process may include a physical etching process, e.g., an ion beam etching (IBE) process. In some example embodiments, the first etching process may include an argon ion sputtering process. In the first etching process, a first incident angle of an ion beam incident on the substrate 100 may be about 50 degrees to about 80 degrees.

When the first etching process is performed, conductive layers in etching target layers may be also etched, so that a conductive by-product may be generated. The conductive by-product may include conductive materials included in the etching target layers. The conductive by-product may be re-deposited on a sidewall of the MTJ structure 115, and thus a conductive pattern 131 may be formed on the sidewall of the MTJ structure 115.

In some example embodiments, the upper electrode 128a may be covered with the upper electrode protective structure 130, and thus the upper electrode protective structure 130 may isolate some or all surfaces 128-1, 128-2, 128-3 of the upper electrode 128a from exposure during the first etching process, such that the upper electrode 128a is not exposed during the first etching process. Thus, the upper electrode 128a may be isolated from being etched (e.g., may not be etched) by the first etching process. That is, the conductive pattern 131 may not include a metal included in the upper electrode 128a having a specific gravity equal to or greater than about 5.0. That is, the conductive pattern 131 may include metals included in the upper electrode protective structure 130, the lower electrode 112a and the middle electrode 116a. As a result, the conductive pattern 131 may be more easily removed based on not including the metal included in the upper electrode 128a. Because the conductive pattern 131 may be more easily removed, a probability of a short of the MTJ structure 115 may be reduced based on the upper electrode protective structure 130 isolating some or all of the upper electrode 128a from exposure during the first etching process.

Figure 10:
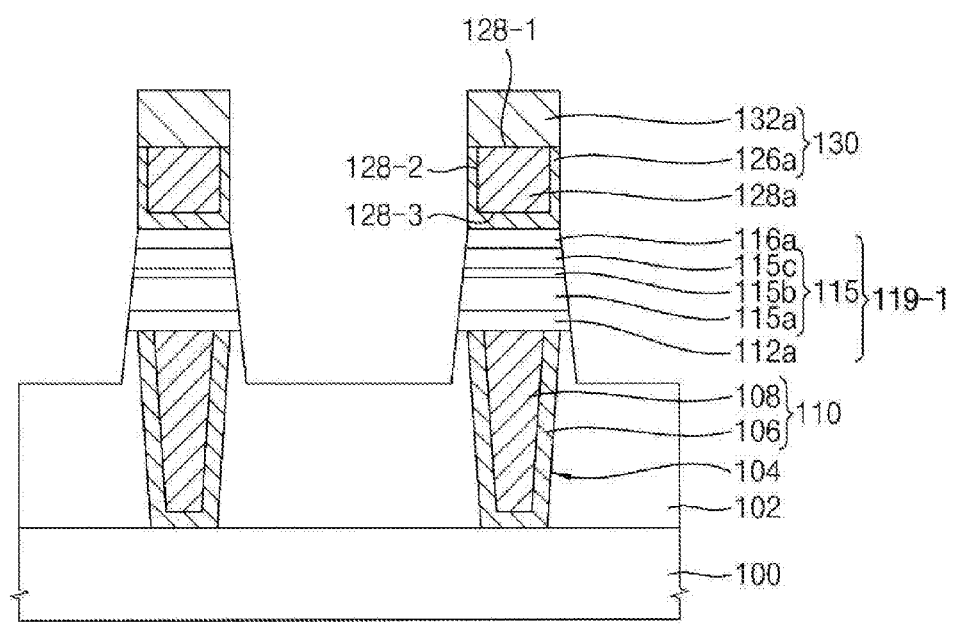

Referring to FIG. 10, the conductive pattern 131 on the sidewall of the MTJ structure 115 may be removed by a second etching process.

In some example embodiments, the second etching process may include a physical etching process, e.g., an ion beam etching (IBE) process. In the second etching process, a second incident angle of an ion beam incident on the substrate 100 may be less than the first incident angle. The second angle may be about 20 degrees to about 40 degrees. The first and second etching processes may be performed in-situ.

In the second etching process, the lower electrode 112a, the MTJ structure 115, the middle electrode 116a, the upper electrode 128a and the upper electrode protective structure 130 may be etched by a predetermined thickness. Also, a portion of the first insulating interlayer 102 between the lower electrodes 112a may be partially etched. However, after ("subsequently to") the second etching process, the upper electrode protective structure 130 may remain and cover one or more surfaces 128-1, 128-2, 128-3 of the upper electrode 128a. Thus, the one or more surfaces of the upper electrode 128a may not be exposed ("may be isolated from exposure by the upper electrode protective structure 130"), during the second etching process.

If the conductive pattern 131 includes a metal of the upper electrode 128a having a specific gravity greater than about 5.0, the conductive pattern 131 may be strongly attached onto the sidewall of the MTJ structure 115. Thus, the conductive pattern 131 may not be removed by the second etching process, and an electrical short between the first magnetic pattern 115a and the second magnetic pattern 115c in the MTJ structure 115 may be generated.

However, the conductive pattern 131 may not include ("may omit," "may be free from," etc.) conductive materials included in the upper electrode 128a, so that the conductive pattern 131 on the sidewall of the MTJ structure 115 may be easily removed by the second etching process. Thus, the electrical short between the first and second magnetic patterns 115a and 115c in the MTJ structure 115 may decrease.

When the second etching process is performed, by-products having conductivity may be generated. However, the by-products may not include a metal having a specific gravity greater than about 5. Thus, the by-products may not be re-deposited, and may be removed by the second etching process.

Thus, the MRAM device shown in FIG. 10 may be manufactured. In some example embodiments, an MRAM device of any of the example embodiments included herein may be incorporated into the manufacture of an electronic device, such that the electronic device includes some or all of the MRAM device.

The MRAM device may include the first insulating interlayer 102 and the lower electrode contact 110 extending through the first insulating interlayer 102 on the substrate 100. A stacked structure including the lower electrode 112a, the MTJ structure 115 and the middle electrode 116a may be formed on the lower electrode contact 110. The upper electrode 128a and the upper electrode protective structure 130 surrounding the surface of the upper electrode 128a may be formed on the stacked structure. The upper electrode protective structure 130 may include the first protective pattern 126a on the sidewall and the bottom of the upper electrode 128a and the second protective pattern 132a covering the upper electrode 128a.

FIG. 11, FIG. 12, FIG. 13, FIG. 14, FIG. 15, FIG. 16, FIG. 17, FIG. 18, FIG. 19, FIG. 20, and FIG. 21 are cross-sectional views illustrating stages of a method of manufacturing an MRAM device according to some example embodiments.

Figure 11:
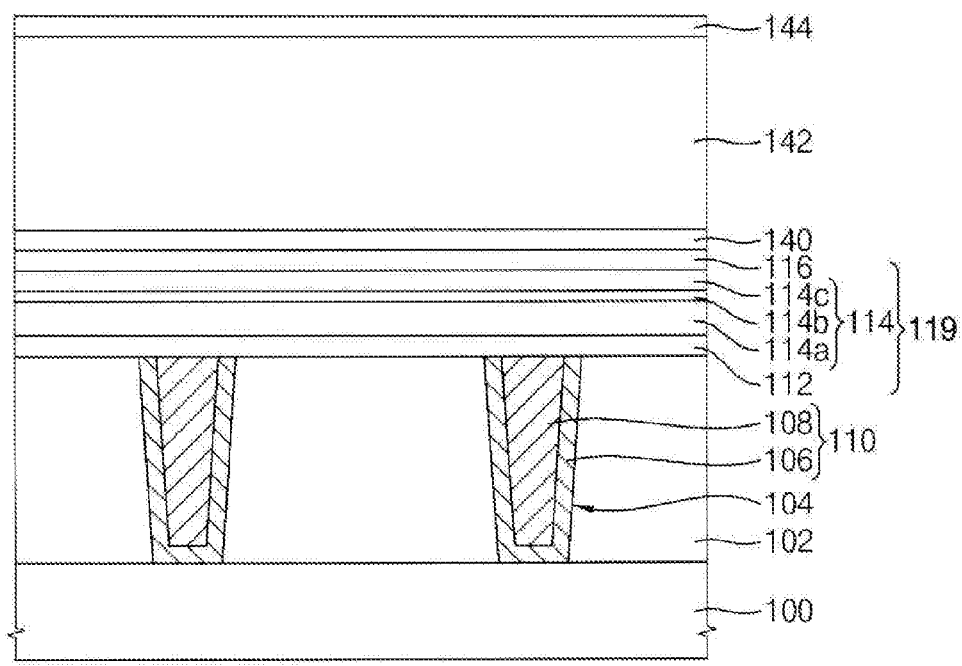

Referring to FIG. 11, the first insulating interlayer 102 may be formed on the substrate 100. The lower electrode contact 110 may be formed though the first insulating interlayer 102. The first insulating interlayer 102 and the lower electrode contact 110 may be formed by processes substantially the same as or similar to those illustrated with reference to FIG. 1.

The lower electrode layer 112, the MTJ layer 114 and the middle electrode layer 116 may be sequentially formed on the first insulating interlayer 102 and the lower electrode contact 110. A capping insulation layer 140, a mold layer 142 and a first hard mask layer 144 may be formed on the middle electrode layer 116. The lower electrode layer 112, the MTJ layer 114 and the middle electrode layer 116 may be formed by processes substantially the same as or similar to those illustrated with reference to FIG. 2.

The capping insulation layer 140 may be formed between the middle electrode layer 116 and the mold layer 142. The capping insulation layer 140 may serve as an adhesion layer for depositing the mold layer 142. Also, the capping insulation layer 140 may serve as an etch stop layer for etching the mold layer 142. Thus, the capping insulation layer 140 may be formed of a material having an etching selectivity with respect to the mold layer 142. The capping insulation layer 140 may include, e.g., silicon nitride. In some example embodiments, the capping insulation layer 140 may not be formed.

The mold layer 142 may include a spin-on hard mask (SOH). The first hard mask layer 144 may serve as an etching mask in the etching the mold layer 142. Thus, the first hard mask layer 144 may be formed of a material having an etching selectivity with respect to the mold layer 142. In some example embodiments, the first hard mask layer 144 may be formed of, e.g., silicon oxynitride or silicon nitride.

Figure 12:
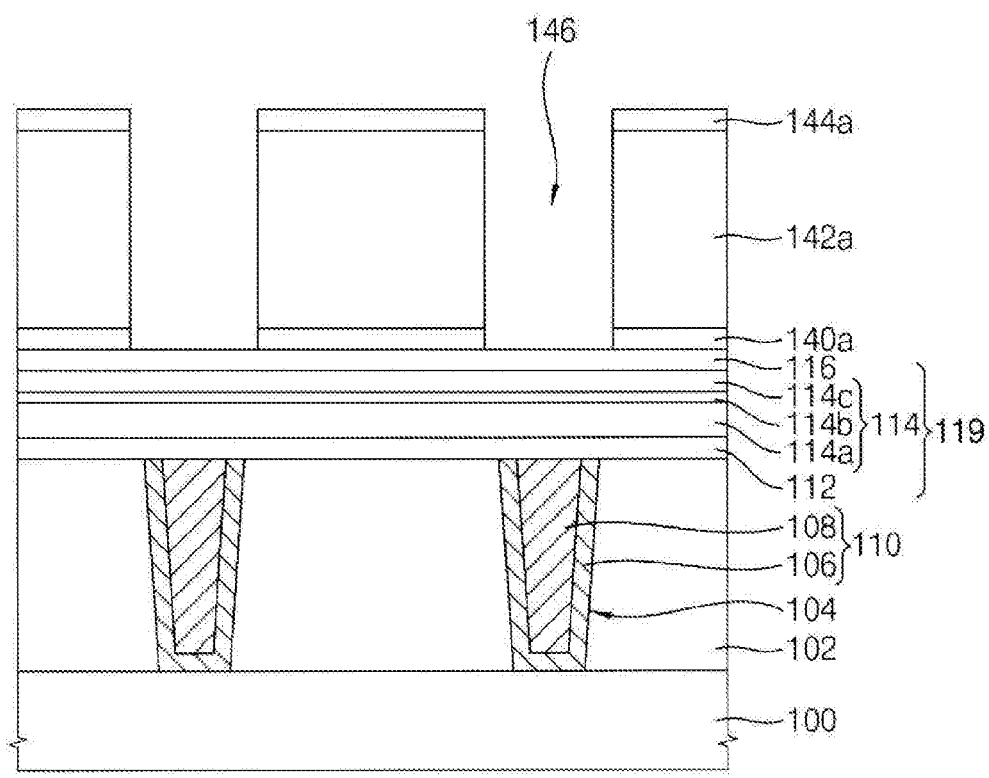

Referring to FIG. 12, the first hard mask layer 144 may be patterned by a photolithography process to form a first hard mask 144a. The first hard mask 144a may include an opening at a portion for forming the upper electrode 128a.

The mold layer 142 and the capping insulation layer 140 may be etched using the first hard mask 144a to form a mold pattern 142a and a capping insulation pattern 140a, respectively. The mold pattern 142a and the capping insulation pattern 140a may include a second opening 146 exposing an upper surface of the MTJ layer 114.

Figure 13:
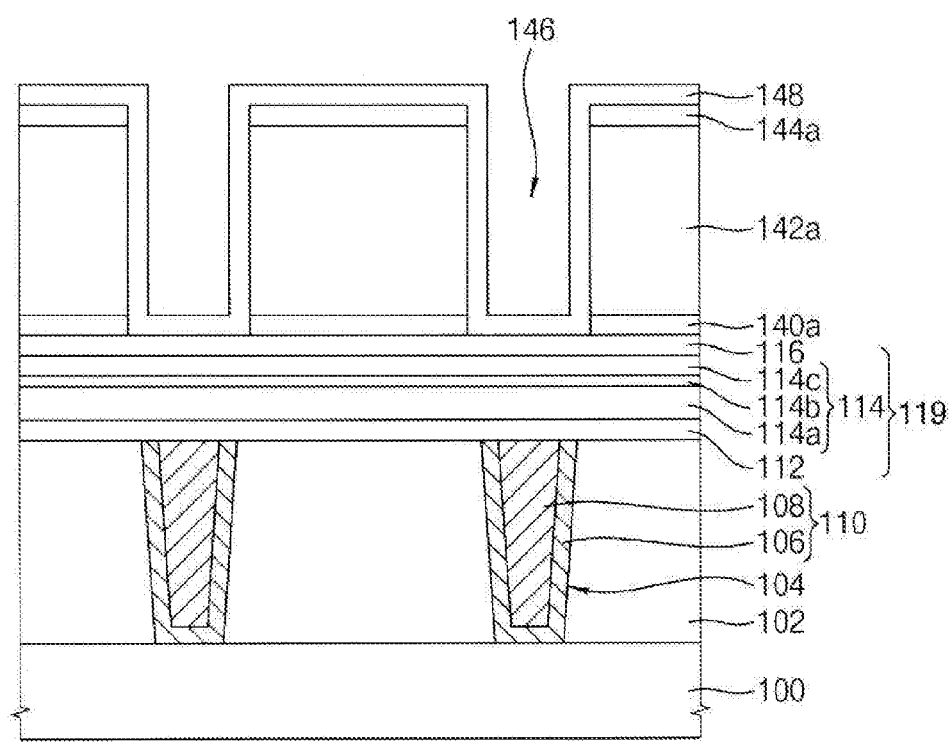

Referring to FIG. 13, a spacer layer 148 may be conformally formed on an inner wall of the second opening 146, the exposed upper surface of the MTJ layer 114, and an upper surface of the first hard mask 144a.

Figure 15:
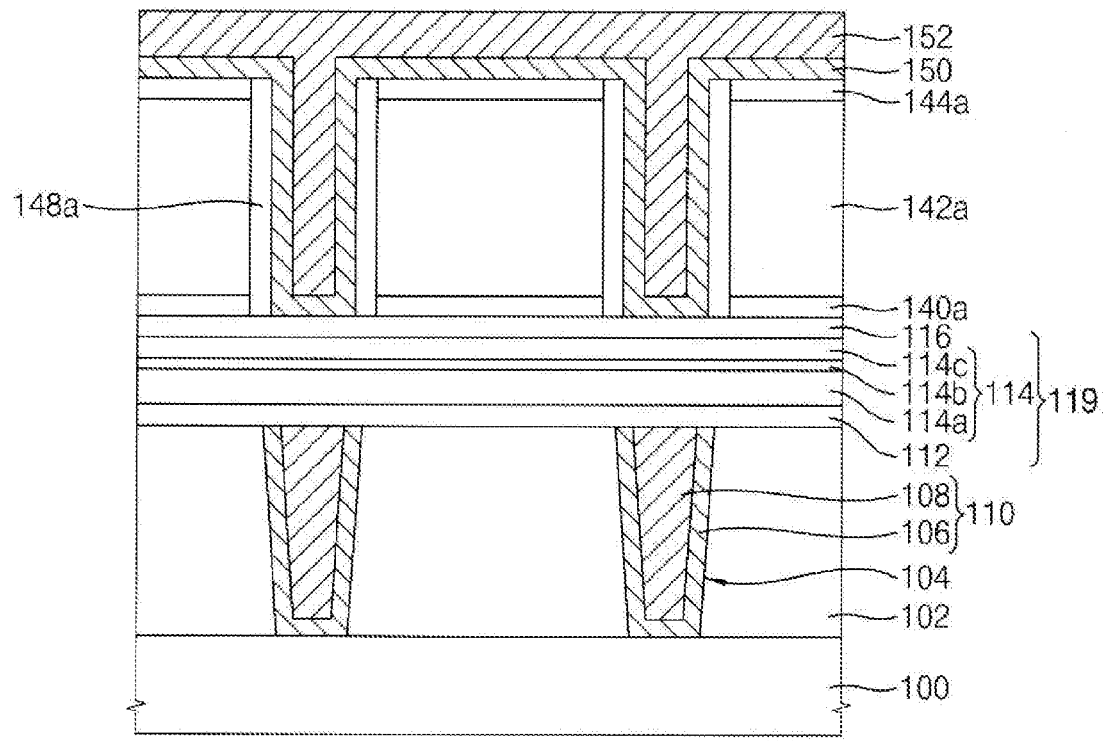

The spacer layer 148 may serve as an adhesion layer for forming the first protective layer 150 (refer to FIG. 15). In some example embodiments, the spacer layer 148 may be formed of, e.g., silicon oxide. The spacer layer 148 may be formed by a CVD process or an ALD process.

Figure 14:
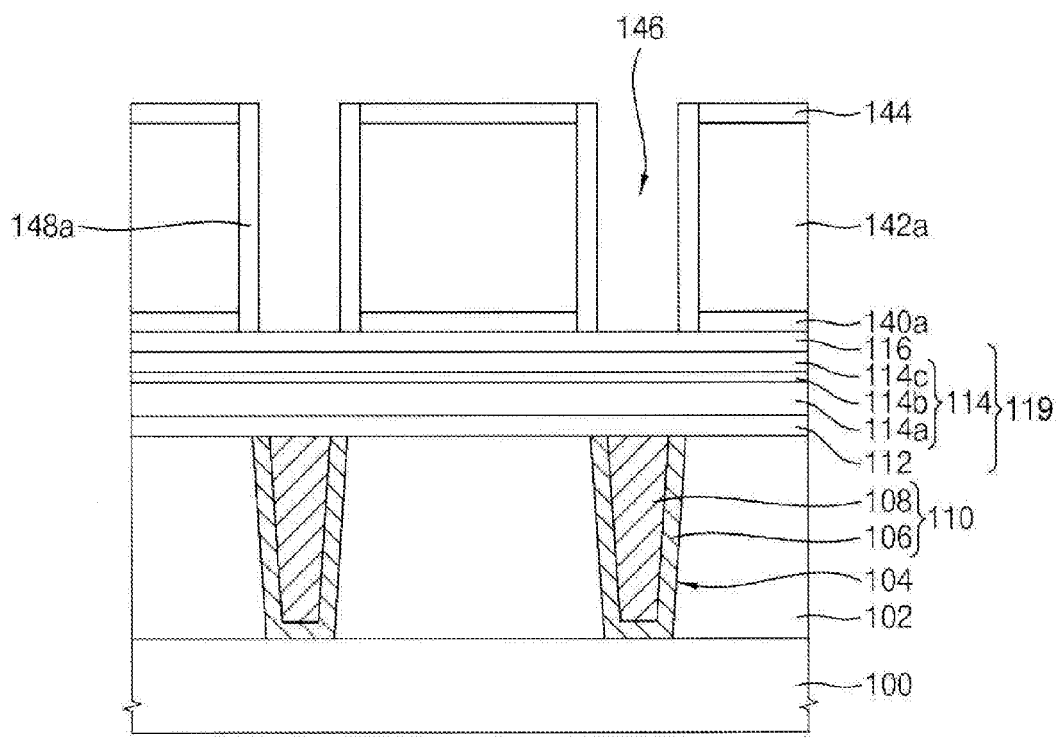

Referring to FIG. 14, the spacer layer 148 may be anisotropically etched to form a spacer 148a on a sidewall of the second opening 146. Thus, the middle electrode layer 116 may be exposed by the second opening 146.

Referring to FIG. 15, the first protective layer 150 may be conformally formed on the first hard mask 144a, the spacer 148a and the middle electrode layer 116. An upper electrode layer 152 may be formed on the first protective layer 150 to fill the second opening 146.

The first protective layer 150 and the upper electrode layer 152 may be formed by processes substantially the same as or similar to those illustrated with reference to FIG. 4. That is, the first protective layer 150 may have a metal having a specific gravity less than a specific gravity of the upper electrode layer 152. The first protective layer 150 may include a conductive material having a resistance lower than a resistance of each of the first protective layer 150 and the middle electrode layer 116.

Figure 16:
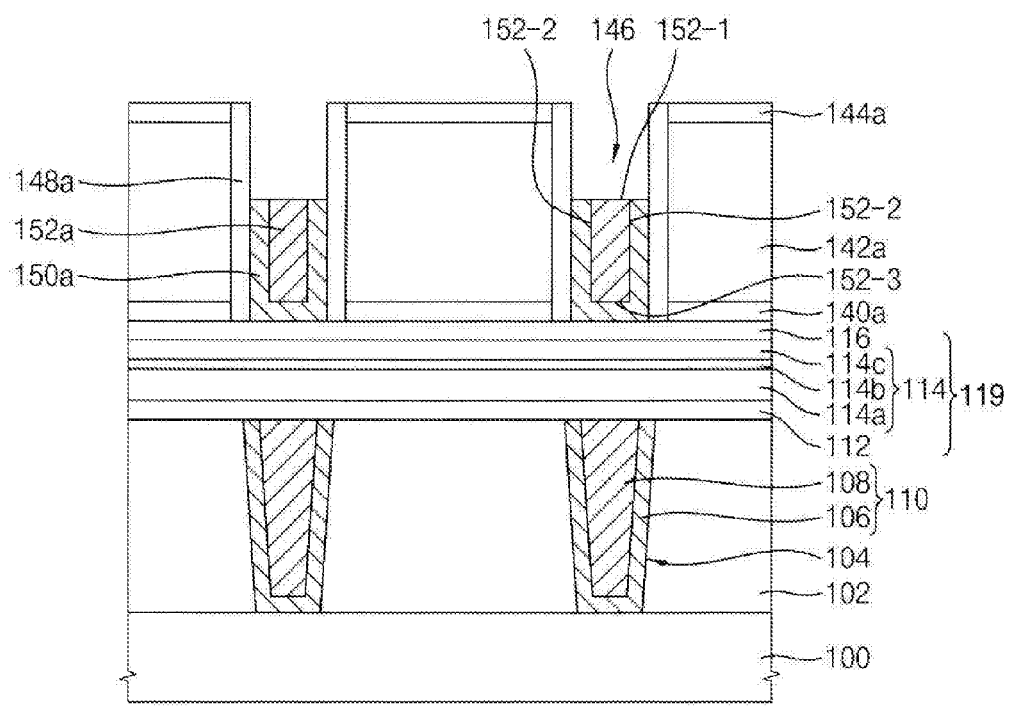

Referring to FIG. 16, portions of the first protective layer 150 and the upper electrode layer 152 on the first hard mask 144a may be removed. Portions of the first protective layer 150 and the upper electrode layer 152 in the second opening 146 may be partially etched to form a first protective pattern 150a and an upper electrode 152a, respectively, filling a lower portion of the second opening 146. The first protective pattern 150a may surround a sidewall 152-2 and a bottom surface 152-3 of the upper electrode 152a. The processes may be substantially the same as or similar to those illustrated with reference to FIG. 5.

Figure 17:
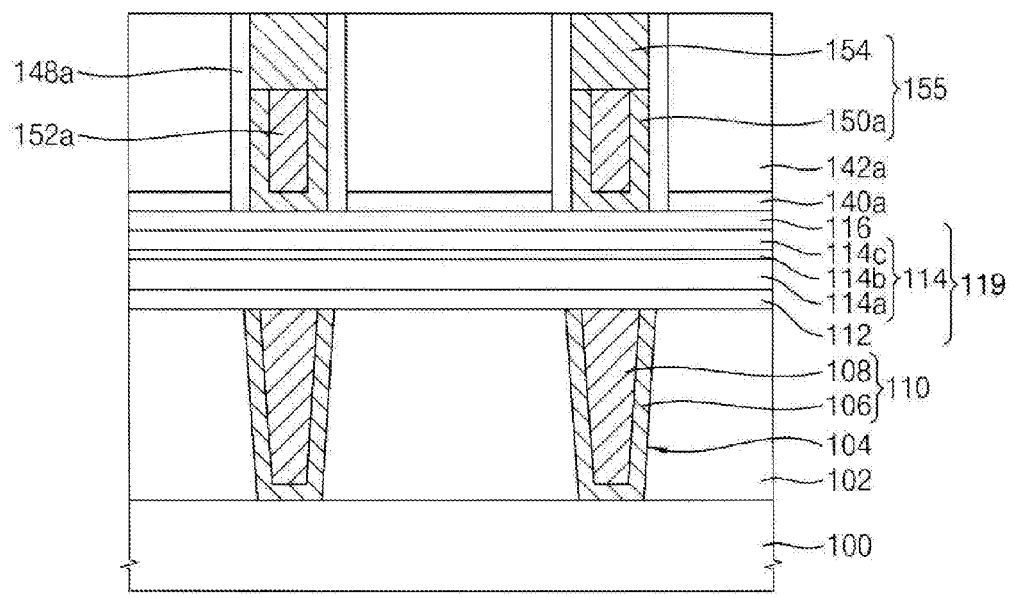

Referring to FIG. 17, a second protective pattern 154 may be formed on the upper electrode 152a and the first protective pattern 150a. The second protective pattern 154 may be formed by processes substantially the same as or similar to those illustrated with reference to FIGS. 6 and 7. Thus, the first and second protective patterns 150a and 154 may form an upper electrode protective structure 155.

Figure 18:
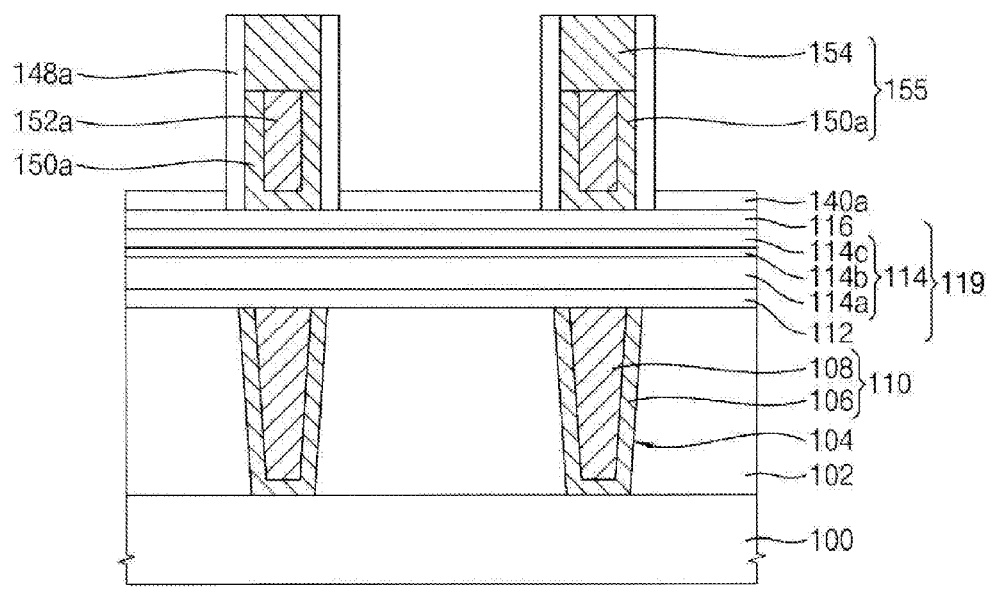

Referring to FIG. 18, the mold pattern 142a may be removed.

In some example embodiments, when the mold pattern 142a includes SOH, the mold pattern 142a may be removed by an ashing process.

Figure 19:
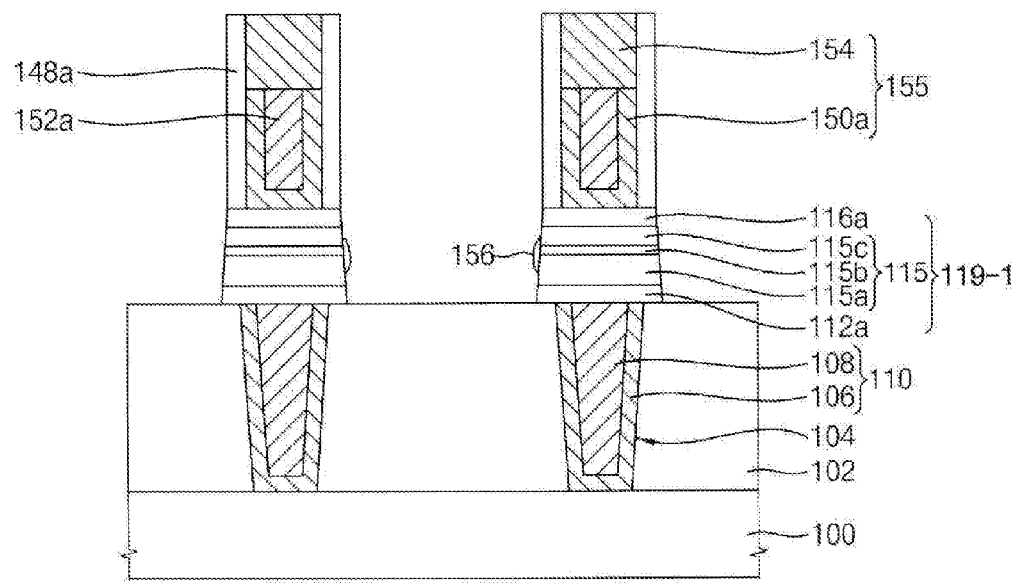

Referring to FIG. 19, the capping insulation pattern 140a may be etched using the upper electrode 152a and the upper electrode protective structure 155 using an etching mask. The middle electrode layer 116, the MTJ layer 114 and the lower electrode layer 112 may be sequentially etched by a first etching process to form the lower electrode 112a, the MTJ structure 115 and the middle electrode 116a on the lower electrode contact 110. The first etching process may be substantially the same as or similar to that illustrated with reference to FIG. 9. Thus, a conductive by-product may be re-deposited on a sidewall of the MTJ structure 115, and thus a conductive pattern 156 may be formed on the sidewall of the MTJ structure 115.

Figure 20:
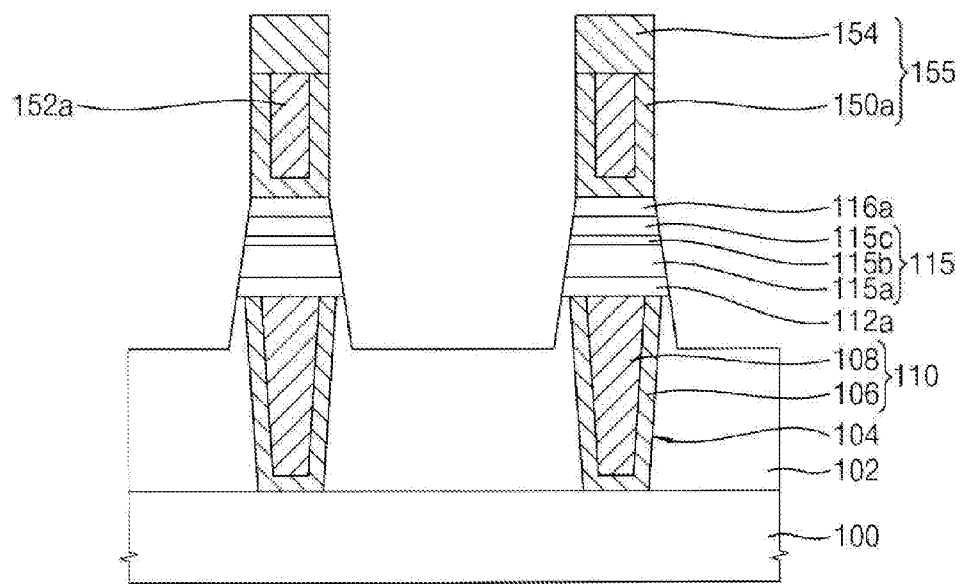
Figure 21:
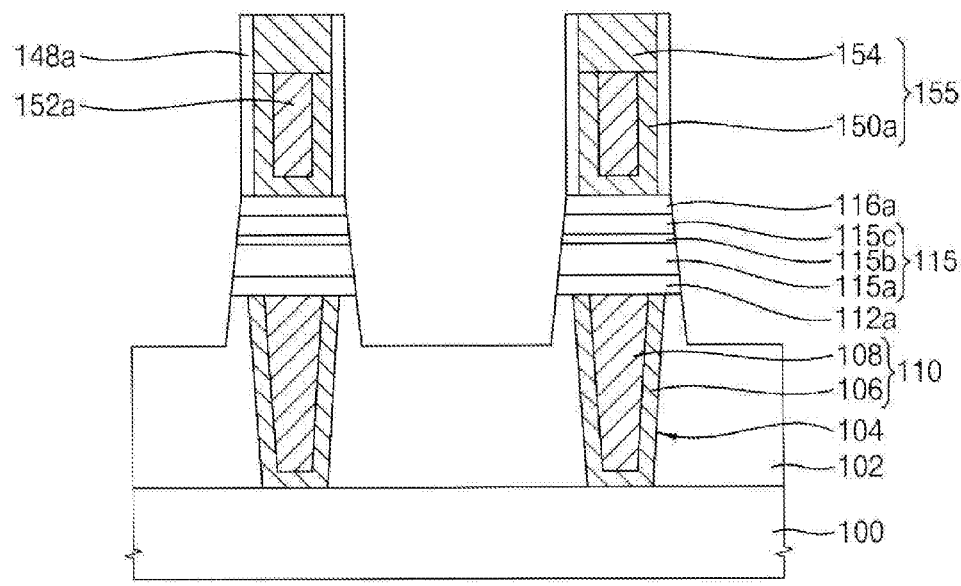

Referring to FIGS. 20 and 21, the conductive pattern 156 on the sidewall of the MTJ structure 115 may be removed by a second etching process. The second etching process may be substantially the same as or similar to that illustrated with reference to FIG. 10. During the second etching process, the first insulating interlayer 102 between the lower electrodes 112a may be partially etched by a predetermined thickness.

As shown in FIG. 20, during the second etching process, the spacer 148a may be completely removed. However, after the second etching process, the upper electrode protective structure 155 may remain and cover the surface of the upper electrode 152a.

A semiconductor device shown in FIG. 20 may be substantially the same the semiconductor device shown in FIG. 10.

In some example embodiments, as shown in FIG. 21, after the second etching process, the spacer 148a may remain.

A semiconductor device shown in FIG. 21 may include the spacer 148a on the sidewall of the upper electrode protective structure 155. Thus, a lower surface of the upper electrode protective structure 155 may be greater than an upper surface of the middle electrode 116a.

FIG. 22, FIG. 23, FIG. 24, FIG. 25, FIG. 26, FIG. 27, and FIG. 28 are cross-sectional views illustrating stages of a method of manufacturing an MRAM device according to some example embodiments.

Figure 22:
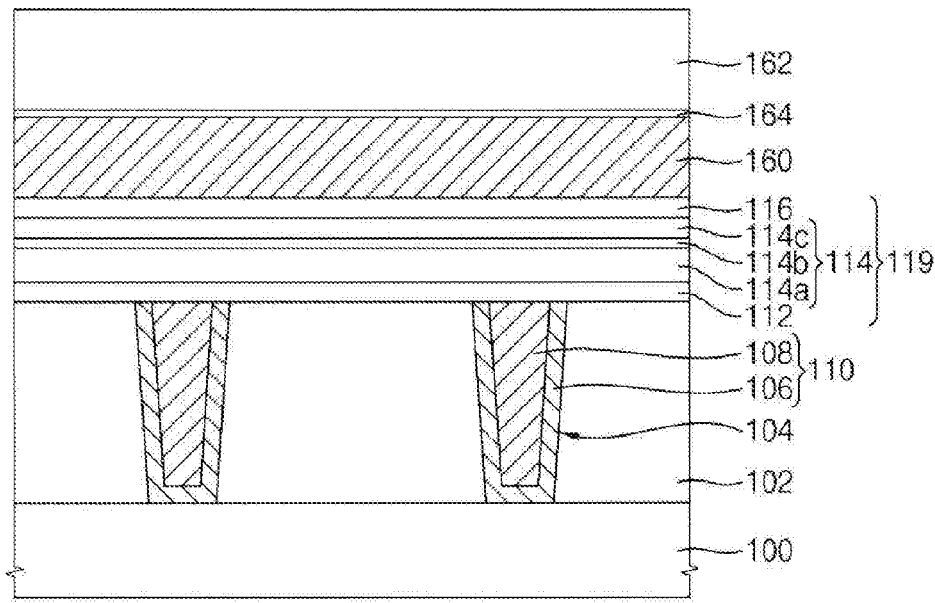

Referring to FIG. 22, the first insulating interlayer 102 may be formed on the substrate 100. The lower electrode contact 110 may be formed through the first insulating interlayer 102. The first insulating interlayer 102 and the lower electrode contact 110 may be formed by processes substantially the same as or similar to those illustrated with reference to FIG. 1.

The lower electrode layer 112, the MTJ layer 114 and the middle electrode layer 116 may be sequentially formed on the first insulating interlayer 102 and the lower electrode contact 110. An upper electrode layer 160 and a first hard mask layer 162 may be sequentially formed on the middle electrode layer 116.

The lower electrode layer 112, the MTJ layer 114 and the middle electrode layer 116 may be formed by processes substantially the same as or similar to those illustrated with reference to FIG. 2. The middle electrode layer 116 may be formed of a material having a specific gravity less than that of a material of the upper electrode layer 160. The middle electrode layer 116 may be formed of a metal nitride, e.g., tantalum nitride, titanium nitride, etc., or a metal, e.g., tantalum, titanium, etc.

The upper electrode layer 160 may be formed of a conductive material having a resistance lower than a resistance of the middle electrode layer 116. The upper electrode layer 160 may be formed of a metal having a specific gravity greater than about 5.0. In some example embodiments, the upper electrode layer 160 may be formed of e.g., tungsten, copper, platinum, nickel, silver, gold, etc. For example, the upper electrode layer 160 may be formed of tungsten.

The first hard mask layer 162 may serve as an etching mask for etching the upper electrode layer 160. The first hard mask layer 162 may be formed of an oxide, e.g., silicon oxide. When the first hard mask layer 162 is formed, an oxygen source gas may be provided so that a first interface oxide layer 164 may be formed on a surface of the upper electrode layer 160. When the upper electrode layer 160 is formed of tungsten, the first interface oxide layer 164 may include tungsten oxide.

Figure 23:
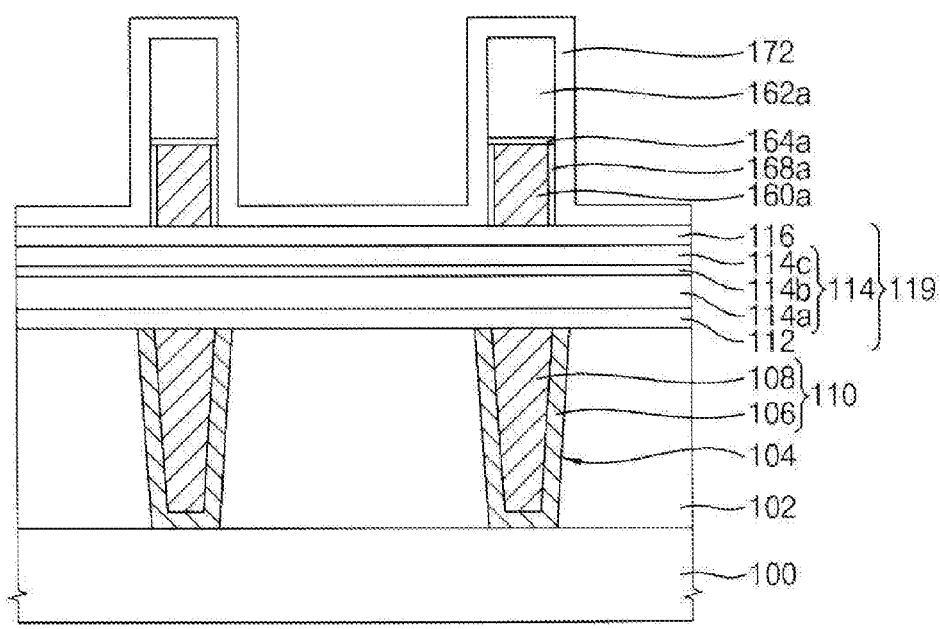

Referring to FIG. 23, the first hard mask layer 162 may be patterned by a photolithography process to form a first hard mask 162a.

The first interface oxide layer 164 and the upper electrode layer 160 may be anisotropically etched using the first hard mask 162a as an etching mask to form a first interface oxide pattern 164a and the upper electrode 160a, respectively. An isotropic etching process may include an RIE process.

A spacer layer 172 may be conformally formed on surfaces of the upper electrode 160a, the first hard mask 162a and the middle electrode layer 116. The spacer layer 172 may be formed of an insulation material including oxygen, e.g., silicon oxide. The spacer layer 172 may be formed by a CVD process or an ALD process.

When the spacer layer 172 is formed, oxygen gas serving as a deposition source gas may be reacted with a sidewall of the upper electrode 160a to form a second interface oxide pattern 168a on the sidewall of the upper electrode 160a. When the upper electrode 160a includes tungsten, the second interface oxide pattern 168a may include tungsten oxide. Thus, the first and second interface oxide patterns 164a and 168a may cover the sidewall and a top surface of the upper electrode 160a. The first and second interface oxide patterns 164a and 168a may serve as an upper electrode protective structure in a subsequent process.

Figure 24:
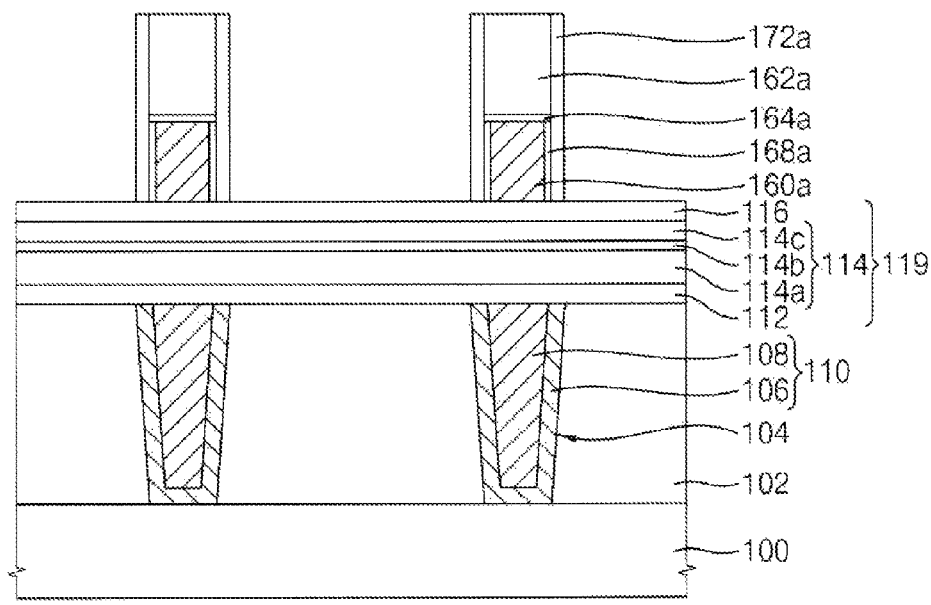

Referring to FIG. 24, the spacer layer 172 may be anisotropically etched to form a spacer 172a on sidewalls of the second interface oxide pattern 168a and the first hard mask 162a. Thus, a surface of the middle electrode layer 116 may be exposed between the spacers 172a.

In some example embodiments, the etching process of the spacer layer 172 may include, e.g., an IBE process or an RIE process.

Figure 25:
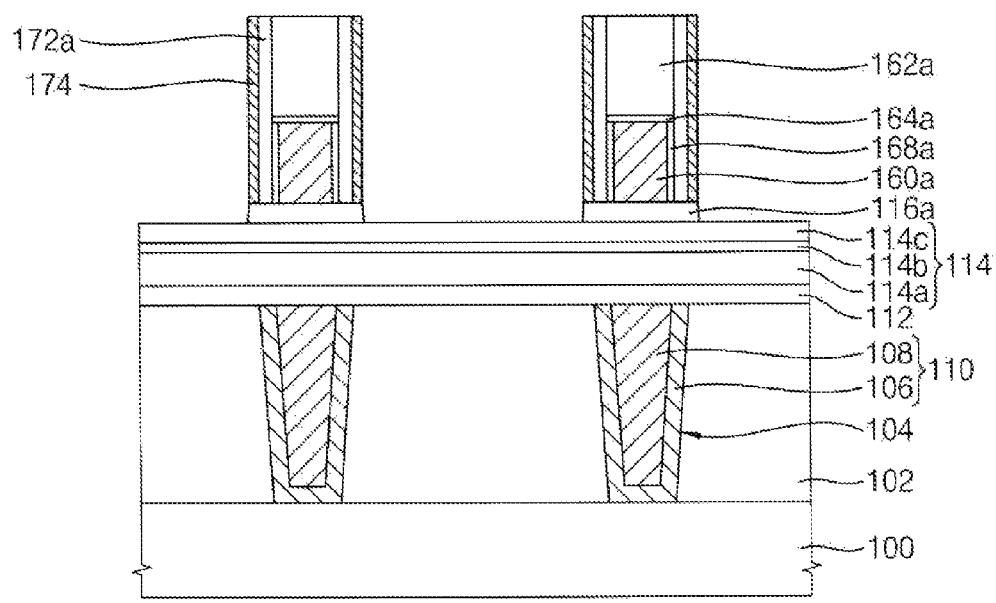

Referring to FIG. 25, the middle electrode layer 116 between the spacers 172a may be etched to form a middle electrode 116a. During etching the middle electrode layer 116, a conductive by-product may be generated. The conductive by-product may be re-deposited on a sidewall of the spacer 172a, and thus a first conductive pattern 174 may be formed on the sidewall of the spacer 172a.

In some example embodiments, a first etching process for etching the middle electrode layer 116 may include a physical etching process, e.g., an ion beam etching (IBE) process. In some example embodiments, the first etching process may include argon ion sputtering process. A first incident angle of the ion beam incident on the substrate 100 may be about 80 to about 90 degrees, so that the first conductive pattern 174 may be sufficiently formed in the first etching process.

The first conductive pattern 174 may include a metal included in the middle electrode layer 116.

Thus, the first conductive pattern 174, the spacer 172a and the first hard mask 162a may cover a surface of the upper electrode 160a. Thus, the surface of the upper electrode 160a may not be exposed. The first conductive pattern 174, the spacer 172a and the first hard mask 162a may serve as an upper electrode protective structure in a subsequent process.

Figure 26:
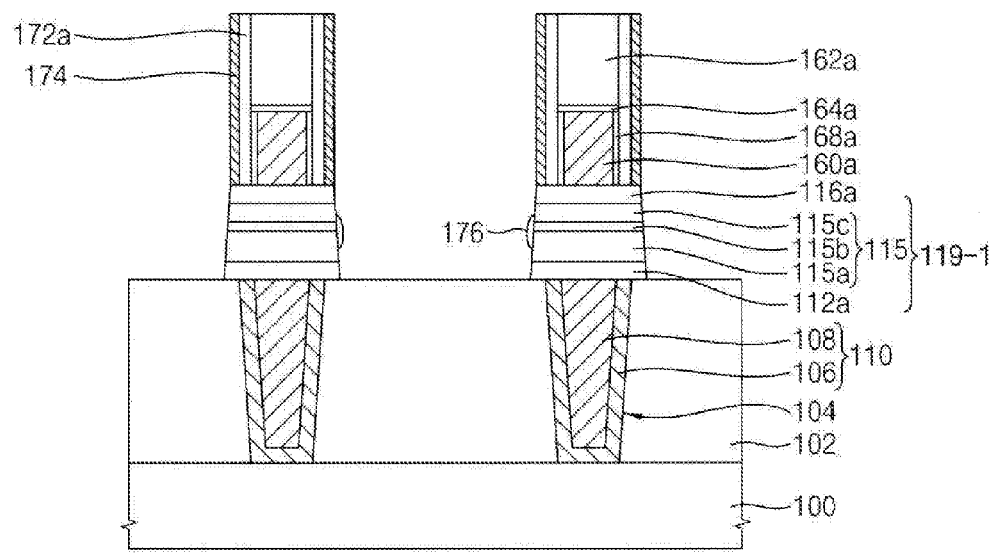

Referring to FIG. 26, the MTJ layer 114 and the lower electrode layer 112 may be sequentially etched using a structure on the MTJ layer as an etching mask. Thus, the lower electrode 112a and the MTJ structure 115 may be formed on the electrode contact 110.

In some example embodiments, a second etching process for forming the lower electrode 112a and the MTJ structure 115 may include a physical etching process, e.g., an ion beam etching (IBE) process. In the second etching process, a second incident angle of an ion beam incident on the substrate 100 may be equal to or lower than the first incident angle. In some example embodiments, the second incident angle may be about 50 degrees to about 80 degrees.

When the second etching process is performed, a conductive by-product including materials included in etch target layers may be generated. The conductive by-product may be re-deposited on a sidewall of the MTJ structure 115, and thus a second conductive pattern 176 may be formed on the sidewall of the MTJ structure 115.

When the second etching process is performed, the first hard mask 162a may be etched by a predetermined thickness, and the first conductive pattern 174 may be partially or completely etched. However, after the second etching process, the surface of the upper electrode 160a may be covered with the first hard mask 162a and the first conductive pattern 174. In some example embodiments, after the second etching process, the surface of the upper electrode 160a may be covered with the first hard mask 162a and the spacer 172a.

The upper electrode 160a may not be etched by the second etching process. Thus, the by-product may not include a metal included in the upper electrode 160a having a specific gravity equal to or greater than about 5.0.

Figure 27:
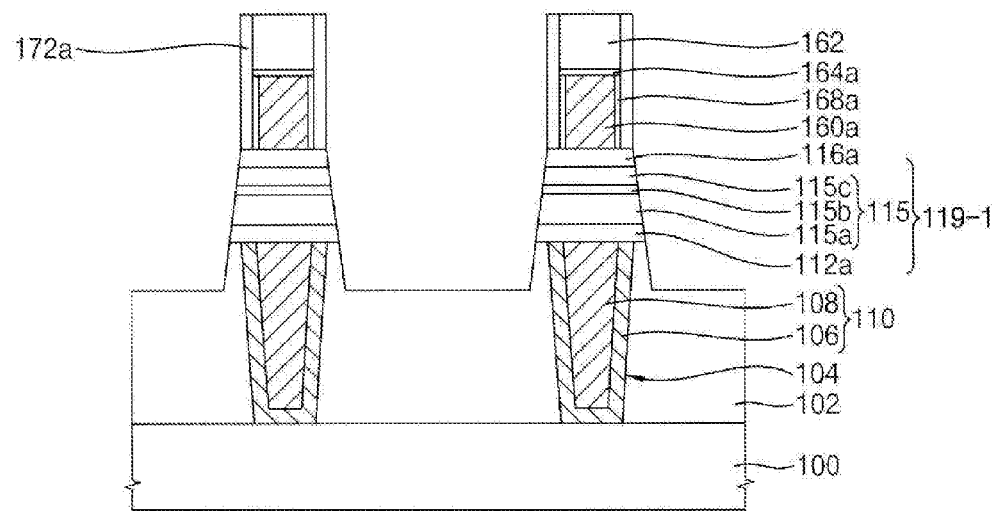
Figure 28:
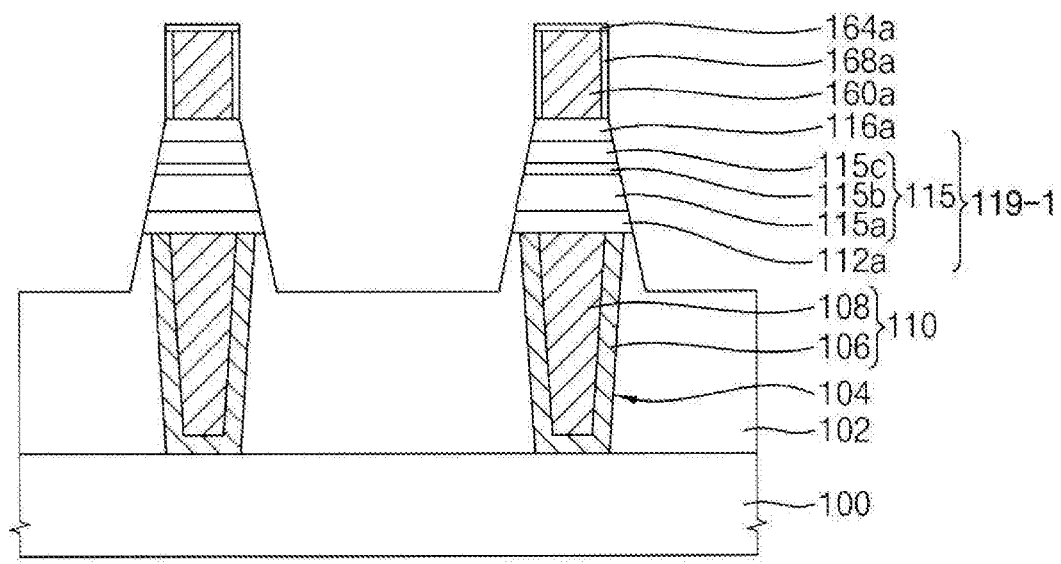

Referring to FIGS. 27 and 28, the second conductive pattern 176 on the sidewall of the MTJ structure 115 may be removed by a third etching process.

In some example embodiments, the third etching process may include a physical etching process, e.g., an ion beam etching (IBE) process. In the third etching process, a third incident angle of an ion beam incident on the substrate 100 may be less than the second incident angle. The third angle may be about 20 degrees to about 40 degrees. The first, second and third etching processes may be performed in-situ.

In some example embodiments, as shown in FIG. 27, in the third etching process, a portion of the first hard mask 162a and the first conductive pattern 174 may be removed. In this case, the first hard mask 162a, the spacer 172a and the first and second interface oxide patterns 164a and 168a may remain on the surface of the upper electrode 160a. Thus, the upper electrode 160a may not be exposed during the third etching process. That is, the first hard mask 162a, the spacer 172a and the first and second interface oxide patterns 164a and 168a may serve as the upper electrode protective structure.

In some example embodiments, as shown in FIG. 28, in the third etching process, the first hard mask 162a, the first conductive pattern 174 and the spacer 172a may be completely removed. In this case, the first and second interface oxide patterns 164a and 168a may remain on the surface of the upper electrode 160a. Thus, the upper electrode 160a may not be exposed during the third etching process. That is, the first and second interface oxide patterns 164a and 168a may serve as the upper electrode protective structure.

The second conductive pattern 176 may be easily removed by the third etching process. Thus, an electrical short between first and second magnetic patterns 155a and 155c in the MTJ structure 115 may decrease. During the third etching process, the upper electrode 160a may not be exposed, so that by-products may not include a metal having a specific gravity equal to or greater than about 5.0. Thus, the by-products may not be re-deposited, and may be removed by the third etching process.

As described above, the semiconductor device shown in FIG. 27 or FIG. 28 may be manufactured.

Referring to FIGS. 27 and 28, the semiconductor device may include the first insulating interlayer 102 and the lower electrode contact 110 extending through the first insulating interlayer 102 on the substrate 100. A stacked structure including the lower electrode 112a, the MTJ structure 115 and the middle electrode 116a may be formed on the lower electrode contact 110. The upper electrode 160a and the upper electrode protective structure surrounding the upper electrode 160a may be formed on the stacked structure. The upper electrode protective structure may include at least the first and second oxide patterns 164a and 168a that may be formed by oxidizing the surface of the upper electrode 160a.

FIG. 29, FIG. 30, FIG. 31, and FIG. 32 are cross-sectional views illustrating stages of a method of manufacturing an MRAM device according to some example embodiments.

Figure 29:
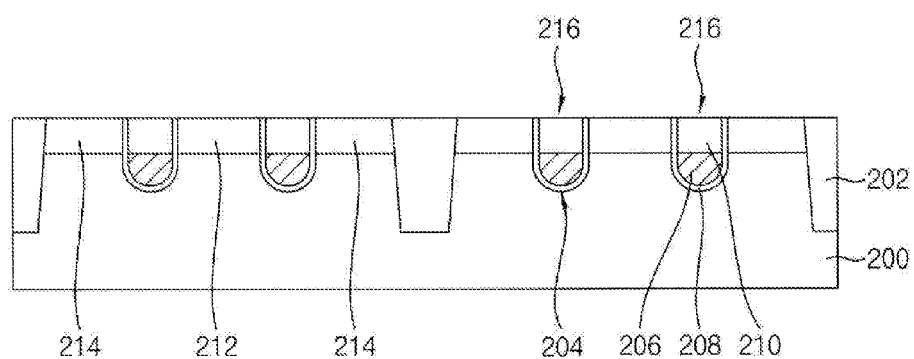

Referring to FIG. 29, an isolation layer 202 may be formed on a substrate 200, and thus an active region and a field region may be defined in the substrate 200. The isolation layer 202 may be formed by a shallow trench isolation (STI) process. A plurality of active regions may be spaced apart from each other, and may be regularly arranged.

A plurality of transistors 216 may be formed on the substrate 200.

In some example embodiments, a mask (not shown) may be formed on the substrate 200. The substrate 200 may be etched using the mask to form a plurality of trenches 204 extending in a first direction. Each of the active regions may include two trenches 204 thereon. A gate structure may be formed to fill each of the trenches 204, and the gate structure may include a gate insulation pattern 206, a gate electrode 208, and a hard mask 210 sequentially stacked. Impurities may be doped into portions of the active region adjacent the gate structure to form a source region 212 and a drain region 214. The source region 212 may be commonly used in adjacent two transistors. Thus, a buried gate type transistor may be formed on the substrate 200.

Figure 30:
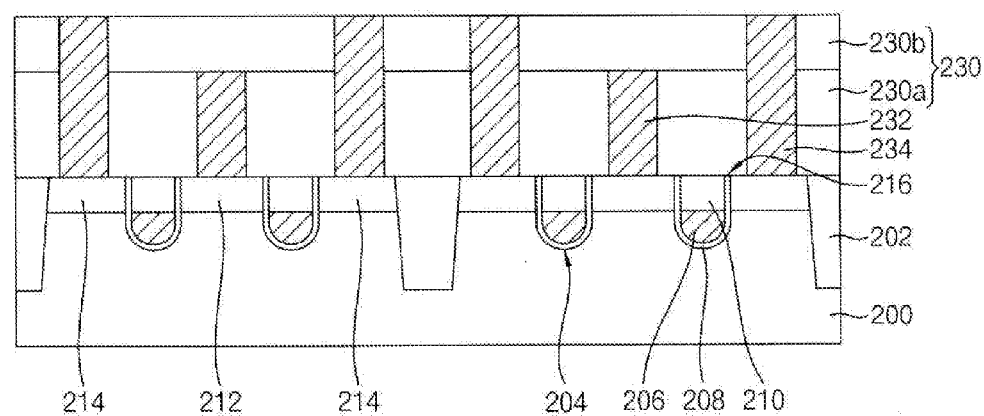

Referring to FIG. 30, a first lower insulating interlayer 230a may be formed on the substrate 200. The first lower insulating interlayer 230a may be partially etched to form a first opening (not shown) exposing the source region 212. A conductive layer may be formed to fill the first opening, and the conductive layer may be planarized to form a source line 232 contacting the source region 212.

A second lower insulating interlayer 230b may be formed on the first lower insulating interlayer 230a and the source line 232.

A second opening (not shown) exposing the drain region 214 may be formed through the first and second lower insulating interlayers 230a and 230b. A second conductive layer may be formed to fill the second opening, and the second conductive layer may be planarized to form a contact plug 234 contacting the drain region 214.

Figure 31:
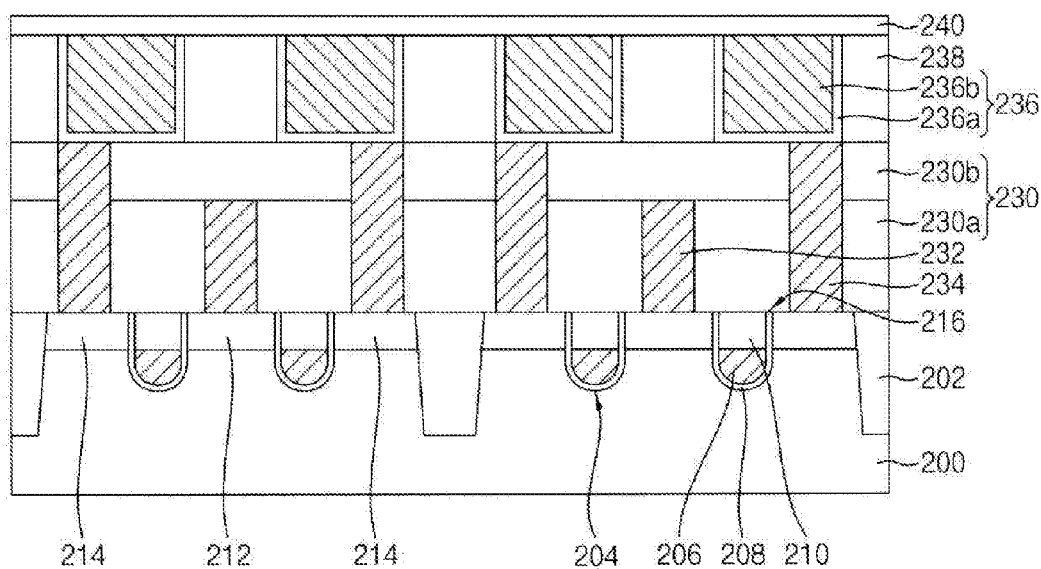

Referring to FIG. 31, a third lower insulating interlayer 238 may be formed on the second lower insulating interlayer 230b. A first wiring structure 236 may be formed on the contact plug 234 through the third lower insulating interlayer 238. An etch stop layer 240 may be formed on the third lower insulating interlayer 238 and the first wiring structure 236.

The third lower insulating interlayer 238 may be formed by a CVD process, an ALD process or a spin coating process.

The first wiring structure 236 may include a barrier layer 236a and a metal pattern 236b.

In some example embodiments, the first wiring structure 236 may be formed by a dual damascene process or a single damascene process. In this case, the metal pattern 236b may include, e.g., copper. In some example embodiments, the first wiring structure 236 may be formed by a photolithography process. In this case, the metal pattern 236b may include, e.g., tungsten, aluminum, etc.

In some example embodiments, the etch stop layer 240 may be formed of, e.g., silicon nitride or silicon oxynitride by a CVD process or an ALD process.

Figure 32:
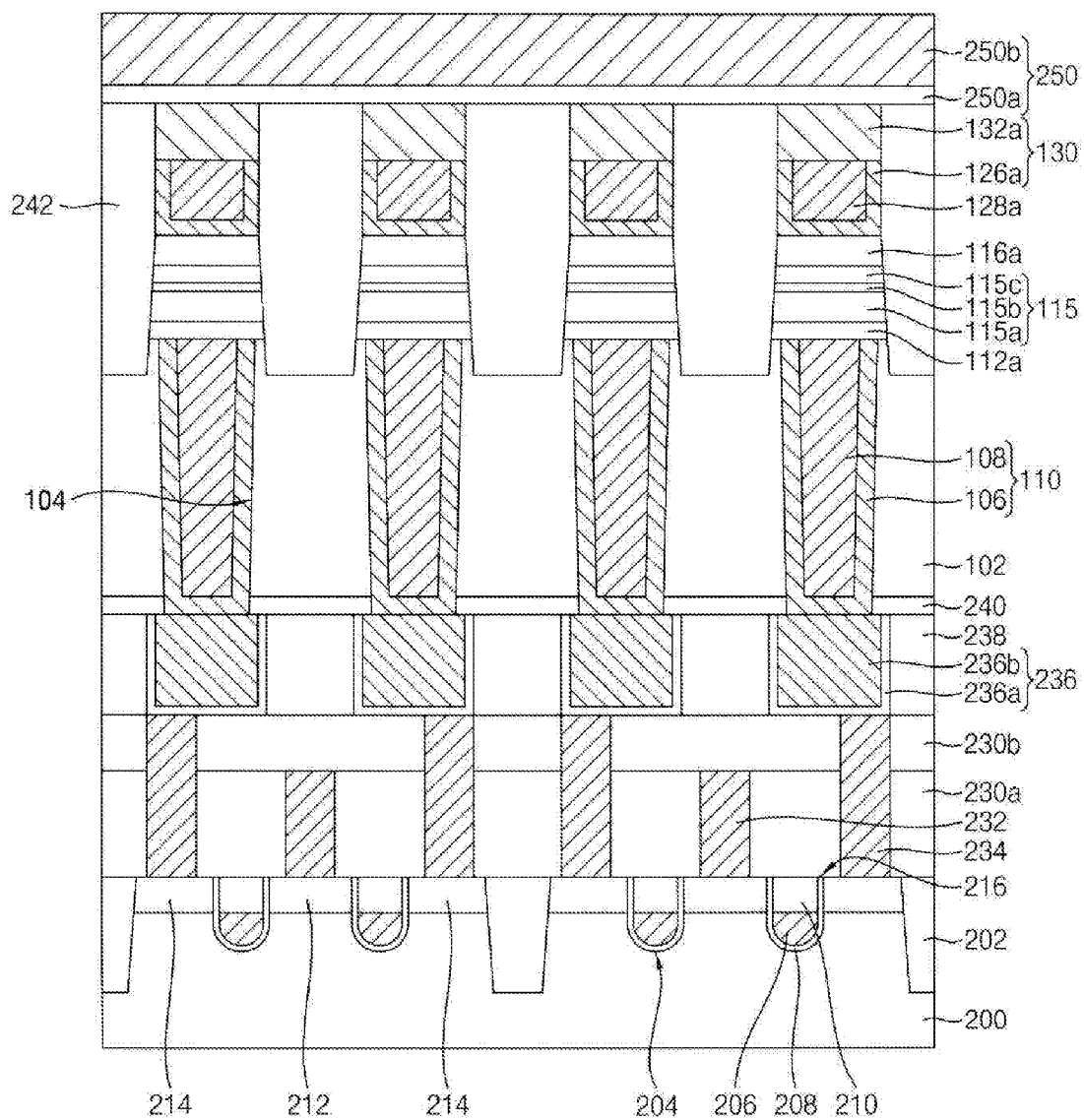

Referring to FIG. 32, processes substantially the same as or similar to those illustrated with reference to FIGS. 1 to 10 may be performed to form a structure shown in FIG. 10 on the first wiring structure 236.

That is, the first insulating interlayer 102 and the lower electrode contact 110 extending through the first insulating interlayer 102 may be formed on the etch stop layer 240. In some example embodiments, the lower electrode contact 110 may contact the first wiring structure 236.

Also, a stacked structure including the lower electrode 112a, the MTJ structure 115 and the middle electrode 116a may be formed on the lower electrode contact 110. The upper electrode 128a and the upper electrode protective structure 130 surrounding a surface of the upper electrode 128a may be formed on the stacked structure. The upper electrode protective structure 130 may include the first protective pattern 126a on a sidewall and a lower surface of the upper electrode 128a and the second protective pattern 132a covering an upper surface of the upper electrode 128a.

In some example embodiments, processes substantially the same as or similar to those illustrated with reference to FIGS. 11 to 21 may be performed to form a structure shown in FIG. 20 or 21 on the first wiring structure 236.

In some example embodiments, processes substantially the same as or similar to those illustrated with reference to FIGS. 22 to 28 may be performed to form a structure shown in FIG. 27 or 28 on the first wiring structure 236.

Then, a second insulating interlayer 242 may be formed on the first insulating interlayer 102 to fill a gap (not shown) between structures each including the upper electrodes 128a and the upper electrode protective structure 130. In some example embodiments, an upper surface of the second insulating interlayer 242 may be planarized.

The second insulating interlayer 242 may be etched to form a trench (not shown) for forming a bit line 250. The trench may extend in a second direction substantially perpendicular to the first direction. In some example embodiments, when the upper electrode protective structure has conductivity, the upper electrode 128a or the upper electrode protective structure 130 may be exposed by the trench. In some example embodiments, when the upper electrode structure has non-conductivity, the upper electrode 128a may be exposed by the trench.

The bit line 250 may be formed to fill the trench. The bit line 250 may be formed by forming a barrier layer on an inner wall of the trench, forming a metal layer on the barrier layer to fill the trench, and planarizing the metal layer and the barrier layer. The bit line 250 may include a barrier pattern 250a and a metal pattern 250b, and may be electrically connected with the upper electrode 128a.

Then, an upper insulating interlayer (not shown) may be further formed on the bit line 250.

The MRAM device according to some example embodiments may be used in a memory device included in an electronic product such as a mobile device, a memory card, and a computer.

Figure 33:
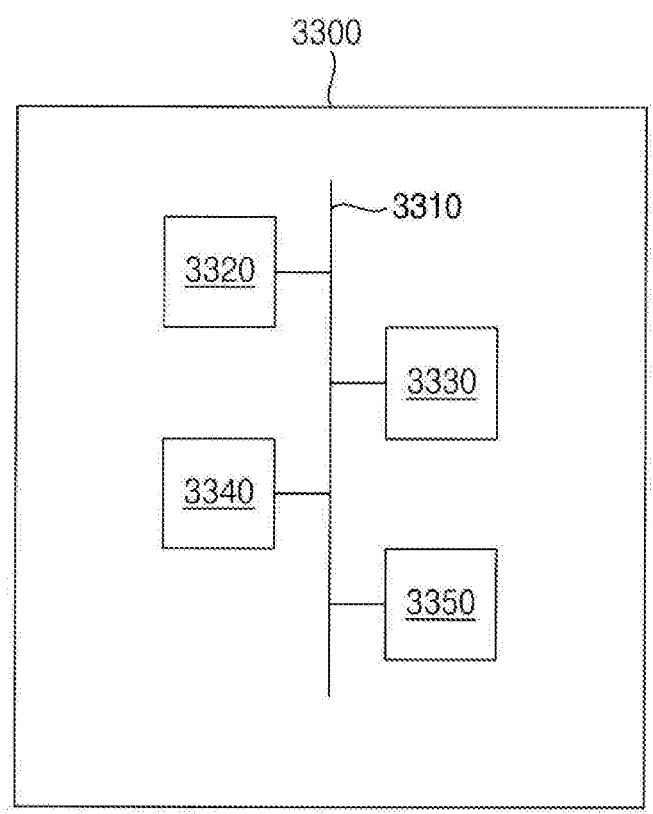
FIG. 33 is a diagram illustrating an electronic device according to some example embodiments.

FIG. 33 is a diagram illustrating an electronic device 3300 according to some example embodiments.

Referring to FIG. 33, the electronic device 3300 includes a memory 3320, a processor 3330, a user interface 3340, and a communication interface 3350.

The electronic device 3300 may be included in one or more various electronic devices. In some example embodiments, the electronic device 3300 may include a computing device. A computing device may include a personal computer (PC), a tablet computer, a laptop computer, a netbook, some combination thereof, or the like. The memory 3320, the processor 3330, the user interface 3340, and the communication interface 3350 may communicate with one another through a bus 3310.

In some example embodiments, the electronic device 3300 may be manufactured to include one or more of the MRAM devices included herein with regard to any of the example embodiments of MRAM devices included herein.

The communication interface 3350 may communicate data from an external device using various Internet protocols. The external device may include, for example, a computing device.

The processor 3330 may execute a program and control the electronic device 3300. A program code to be executed by the processor 3330 may be stored in the memory 3320. An electronic system may be connected to an external device through an input/output device (not shown) and exchange data with the external device.

The memory 3320 may store information. The memory 3320 may be a volatile or a nonvolatile memory. The memory may be a magnetic memory device (e.g., an MRAM) according to any of the example embodiments of MRAM devices included herein. The memory 3320 may be a non-transitory computer readable storage medium. The memory may store computer-readable instructions that, when executed, cause the execution of one or more methods, functions, processes, etc. as described herein. In some example embodiments, the processor 3330 may execute one or more of the computer-readable instructions stored at the memory 3320.

In some example embodiments, the communication interface 3350 may include a USB and/or HDMI interface. In some example embodiments, the communication interface 3350 may include a wireless communication interface.

In some example embodiments, an electronic device 3300 may be configured to implement some or all of the operations described and illustrated herein. In some example embodiments, the electronic device 3300 may be configured to at least partially fabricate ("form," "manufacture," etc.) an MRAM device and/or electronic device according to any of the example embodiments included herein.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an MRAM device, the method comprising:
   forming an insulating interlayer and a lower electrode contact on a substrate, the lower electrode contact extending through the insulating interlayer;
   sequentially forming, on the insulating interlayer and the lower electrode contact, a lower electrode layer, a magnetic tunnel junction layer and a middle electrode layer;
   forming an upper electrode on the middle electrode layer;
   forming an upper electrode protective structure covering a sidewall of the upper electrode and an upper surface of the upper electrode; and
   patterning the middle electrode layer, the magnetic tunnel junction layer and the lower electrode layer according to an etching process, and using the upper electrode and the upper electrode protective structure as an etching mask, to form a middle electrode, a magnetic tunnel junction pattern and a lower electrode, respectively, such that the upper electrode protective structure isolates the Supper electrode from exposure during the patterning, and the upper electrode protective structure remains on the upper electrode subsequently to the patterning.

2. The method of claim 1, wherein the upper electrode includes a metal, the metal having a resistance lower than a resistance of each of the upper electrode protective structure and the middle electrode, the metal having a specific gravity greater than about 5.0.

3. The method of claim 1, wherein the upper electrode includes tungsten, copper, platinum, nickel, silver or gold.

4. The method of claim 1, wherein the upper electrode protective structure includes a metal having a specific gravity less than a specific gravity of the upper electrode.

5. The method of claim 1, wherein the upper electrode protective structure includes a metal having a specific gravity less than about 5.0.

6. The method of claim 1, wherein the upper electrode protective structure includes titanium or titanium nitride.

7. The method of claim 1, wherein,
the upper electrode protective structure includes a first protective pattern and a second protective pattern,
the first protective pattern covers the sidewall of the upper electrode and a bottom surface of the upper electrode, and
the second protective pattern covers the upper surface of the upper electrode.

8. The method of claim 1, further comprising:
oxidizing a surface of the upper electrode, such that the upper electrode protective structure includes a metal oxide.

9. A method of manufacturing an MRAM device, the method comprising:
forming an insulating interlayer and a lower electrode contact on a substrate, the lower electrode contact extending through the insulating interlayer;
sequentially forming, on the insulating interlayer and the lower electrode contact, a lower electrode layer, a magnetic tunnel junction layer and a middle electrode layer;
forming a mold pattern on the middle electrode layer, the mold pattern including an opening, the opening exposing an upper surface of the middle electrode layer;
forming an upper electrode and an upper electrode protective structure in the opening, the upper electrode protective structure covering a surface of the upper electrode in the opening;
removing the mold pattern; and
patterning the middle electrode layer, the magnetic tunnel junction layer and the lower electrode layer according to an etching process, and using the upper electrode and the upper electrode protective structure as an etching mask, to form a middle electrode, a magnetic tunnel junction pattern and a lower electrode, respectively, such that
the upper electrode protective structure isolates the upper electrode from exposure during the patterning, and
the upper electrode protective structure remains on the upper electrode subsequently to the patterning.

10. The method of claim 9, wherein forming the upper electrode and the upper electrode protective structure includes,
forming a first protective layer on an upper surface of the mold pattern, a sidewall of the opening and an upper surface of the middle electrode layer;
forming the upper electrode on the first protective layer, such that the upper electrode at least partially fills the opening;
forming a second protective layer on the upper electrode and the first protective layer, such that the upper electrode and the second protective layer collectively fill the opening; and
planarizing the first and second protective layers, such that an upper surface of the mold pattern is exposed to form the upper electrode protective structure, the upper electrode protective structure including a first protective pattern and a second protective pattern.

11. The method of claim 9, wherein the mold pattern includes silicon oxide.

12. The method of claim 9, wherein the upper electrode protective structure includes a metal having a specific gravity that is less than a specific gravity of the upper electrode.

13. The method of claim 9, further comprising:
removing a conductive by-product from a sidewall of the magnetic tunnel junction pattern, subsequently to forming the lower electrode, the magnetic tunnel junction pattern and the middle electrode.

14. The method of claim 13, wherein,
the removing includes removing an upper portion of a first insulating interlayer, and
the upper electrode protective structure isolates the upper electrode from exposure during the removing, such that the upper electrode protective structure remains on the upper electrode, subsequently to the removing.

15. The method of claim 9, further comprising:
forming an insulation spacer on a sidewall of the mold pattern, subsequently to forming the mold pattern.

16. A method, comprising:
forming an upper electrode and an upper electrode protective structure on a magnetic tunnel junction stack, the magnetic tunnel junction stack including a lower electrode layer, a magnetic tunnel junction layer, and a middle electrode layer, the upper electrode protective structure covering at least one surface of a sidewall of the upper electrode and an upper surface of the upper electrode; and
patterning the magnetic tunnel junction stack according to an etching process, using the upper electrode and the upper electrode protective structure as an etching mask, to form a middle electrode, a magnetic tunnel junction pattern and a lower electrode, respectively, such that
the upper electrode protective structure isolates the upper electrode from exposure during the patterning, and
the upper electrode protective structure remains on the upper electrode subsequently to the patterning.

17. The method of claim 16, further comprising:
manufacturing an MRAM device based on the upper electrode protective structure, the upper electrode, the middle electrode, the magnetic tunnel junction pattern, and the lower electrode, such that the MRAM device includes the upper electrode protective structure, the upper electrode, the middle electrode, the magnetic tunnel junction pattern, and the lower electrode.

18. The method of claim 17, further comprising:
manufacturing an electronic device based on the MRAM device, such that the electronic device includes the upper electrode protective structure, the upper electrode, the middle electrode, the magnetic tunnel junction pattern, and the lower electrode.

19. The method of claim 16, wherein,
the magnetic tunnel junction stack further includes a mold pattern on the middle electrode layer, the mold pattern including an opening, the opening exposing an upper surface of the middle electrode layer,
the forming the upper electrode and the upper electrode protective structure on the magnetic tunnel junction stack includes forming the upper electrode and the upper electrode protective structure in the opening, such that the upper electrode protective structure covers a surface of the upper electrode in the opening, and
the method further includes removing the mold pattern, subsequently to forming the upper electrode and the upper electrode protective structure.

20. The method of claim 16, wherein the forming the upper electrode and the upper electrode protective structure on the magnetic tunnel junction stack includes,
forming a stacked structure on the middle electrode layer, the stacked structure including the upper electrode and a hard mask,
forming the upper electrode protective structure covering the sidewall of the upper electrode and the upper surface of the upper electrode, and
forming an insulation spacer on a sidewall of the stacked structure.

* * * * *